(12) United States Patent
Fujie et al.

(10) Patent No.: US 9,709,631 B2
(45) Date of Patent: Jul. 18, 2017

(54) DIAGNOSIS APPARATUS FOR FIELD WINDING TYPE ROTATING ELECTRIC MACHINE AND DIAGNOSIS METHOD FOR FIELD WINDING TYPE ROTATING ELECTRIC MACHINE

(71) Applicant: Mitsubishi Electric Corporation, Tokyo (JP)

(72) Inventors: Kenichi Fujie, Tokyo (JP); Katsuya Tsujimoto, Tokyo (JP); Takamasa Asai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/897,088

(22) PCT Filed: Jul. 24, 2013

(86) PCT No.: PCT/JP2013/070027
§ 371 (c)(1),
(2) Date: Dec. 9, 2015

(87) PCT Pub. No.: WO2015/011798
PCT Pub. Date: Jan. 29, 2015

(65) Prior Publication Data
US 2016/0146890 A1    May 26, 2016

(51) Int. Cl.
*G01R 31/34*    (2006.01)
*H02P 29/024*    (2016.01)
(Continued)

(52) U.S. Cl.
CPC ............ *G01R 31/346* (2013.01); *H02H 3/08* (2013.01); *H02H 3/16* (2013.01); *H02H 7/1225* (2013.01);
(Continued)

(58) Field of Classification Search
CPC ..... G01R 31/34; G01R 31/343; G01R 31/346; G01R 31/40; G01R 31/42
See application file for complete search history.

(56) References Cited

U.S. PATENT DOCUMENTS

| 7,514,906 B1 * | 4/2009 | Tsujimoto ............... H02P 9/48 290/40 A |
| 2006/0011169 A1 | 1/2006 | Hagari |
| 2007/0008666 A1 * | 1/2007 | Morita .................. B60L 3/0023 361/42 |

FOREIGN PATENT DOCUMENTS

| JP | 07-132000 A | 5/1995 |
| JP | 2006-029158 A | 2/2006 |

(Continued)

OTHER PUBLICATIONS

International Search Report of PCT/JP2013/070027 dated Oct. 29, 2013.

*Primary Examiner* — Tung X Nguyen
(74) *Attorney, Agent, or Firm* — Sughrue Mion, PLLC; Richard C. Turner

(57) ABSTRACT

The present invention relates to a diagnosis apparatus for a field winding type rotating electric machine. The diagnosis apparatus includes an internal power supply circuit having an open fault determination potential, and determines, on the basis of a measurement result of a voltage value of a circuit that includes the field winding in a fault diagnosis condition, that a disconnection has occurred in the circuit when the measurement result is within an open fault determination voltage range including the open fault determination potential, that a power fault has occurred in the circuit when the measurement result is within a power fault determination voltage range including the positive electrode potential, and that an earth fault has occurred in the circuit when the (Continued)

measurement result is within an earth fault determination voltage range including the negative electrode potential.

17 Claims, 10 Drawing Sheets

(51) Int. Cl.
    *H02H 3/08*     (2006.01)
    *H02H 3/16*     (2006.01)
    *H02H 7/122*     (2006.01)

(52) U.S. Cl.
    CPC ......... *H02H 7/1227* (2013.01); *H02P 29/025* (2013.01); *H02P 2207/05* (2013.01)

(56) References Cited

FOREIGN PATENT DOCUMENTS

| JP | 2007-185027 A | 7/2007 |
|----|---------------|--------|
| JP | 4263193 B2    | 5/2009 |

* cited by examiner

DIAGNOSIS APPARATUS FOR FIELD WINDING TYPE ROTATING ELECTRIC MACHINE AND DIAGNOSIS METHOD FOR FIELD WINDING TYPE ROTATING ELECTRIC MACHINE

CROSS REFERENCE TO RELATED APPLICATIONS

This is a National Stage of International Application No. PCT/JP2013/070027 filed Jul. 24, 2013, the contents of which are incorporated herein by reference in its entirety.

TECHNICAL FIELD

The present invention relates to a diagnosis apparatus and a diagnosis method for a field winding type rotating electric machine used in a vehicle or the like.

BACKGROUND ART

In a conventional diagnosis apparatus for a field winding type rotating electric machine, a voltage of a field winding undergoing a fault diagnosis in a field winding type rotating electric machine is maintained at a diagnosis reference potential obtained by dividing a positive electrode voltage of a direct current power supply using a bias resistor, and when a measured voltage of the field winding is determined to have shifted from the diagnosis reference potential to the positive electrode voltage or a negative electrode voltage of the direct current power supply, a power fault, an earth fault, and an open fault are determined to have occurred in a field circuit that includes a field driving circuit and the field winding (see Patent Document 1, for example).

CITATION LIST

Patent Literature

[PTL 1] Japanese Patent No. 4263193

SUMMARY OF INVENTION

Technical Problem

However, this conventional technique has the following problems.

In the diagnosis apparatus for a field winding type rotating electric machine according to Patent Document 1, only two potentials, namely the positive electrode voltage and the negative electrode voltage of the direct current power supply, are provided as potentials used in the comparison for determining a fault. Therefore, although it is possible to detect the occurrence of one of a power fault, an earth fault, and an open fault in the field circuit, it is impossible to distinguish the power fault and the earth fault from the open fault as the cause of the fault.

Further, when a leak current caused by salty water or muddy salty water exists between the field winding and the direct current power supply, the voltage of the field winding varies in accordance with the leak current so as to approach the positive electrode voltage or the negative electrode voltage of the direct current power supply, and as a result, a power fault, an earth fault, or an open fault is detected erroneously.

This erroneous detection is particularly likely to occur when a resistance value of the bias resistor is larger than a leak resistance value by at least a single digit, for example, so as to be more easily affected by the leak current. The erroneous detection also occurs notably when there is no leeway in a potential difference between the positive electrode voltage or negative electrode voltage of the direct current power supply and the aforesaid diagnosis reference potential.

When an attempt is made to suppress the effect of the leak current by reducing the resistance value of the bias resistor, on the other hand, a current of the bias resistor increases, leading to an increase in power consumption. Moreover, a rated power of the bias resistor must be increased to avoid burnout of the bias resistor.

In the diagnosis apparatus for a field winding type rotating electric machine according to Patent Document 1, no specific mention is made of a method of setting the resistance value of the bias resistor, and therefore the need remains for a circuit configuration method with which erroneous detection of a power fault and an earth fault caused by the effects of a leak current can be suppressed, and a specific method of setting resistance values and so on of constituent electronic components of the circuit.

The present invention has been designed to solve the problems described above, and an object thereof is to obtain a diagnosis apparatus for a field winding type rotating electric machine and a diagnosis method for a field winding type rotating electric machine, with which a power fault and an earth fault can be distinguished from an open fault when determining the cause of a fault in a field circuit that includes a field driving circuit and a field winding, and with which erroneous detection of a power fault and an earth fault can be suppressed even when a leak current exists between a direct current power supply and the field winding.

Solution to Problem

A diagnosis apparatus for a field winding type rotating electric machine according to the present invention is a diagnosis apparatus for a field winding type rotating electric machine having a field winding, an armature winding, and a direct current power supply that serves as a power supply source for the field winding and the armature winding, the diagnosis apparatus being applied to a rotating electric machine that operates as a motor or a power generator, the diagnosis apparatus having a diagnosis circuit that includes an internal power supply circuit having an open fault determination potential set at a different value to a positive electrode potential and a negative electrode potential of the direct current power supply so that in a fault diagnosis condition in which an induced current generated by a relative rotary motion of the armature winding does not flow through the field winding, the diagnosis circuit performs a fault diagnosis on a circuit including the field winding by measuring a voltage value of the circuit including the field winding that is generated when a current is passed through the field winding using the internal power supply circuit, wherein, on the basis of a measurement result of the voltage value of the circuit including the field winding in the fault diagnosis condition, the diagnosis circuit determines that a disconnection has occurred in the circuit when the measurement result is within an open fault determination voltage range including the open fault determination potential, determines that a power fault has occurred in the circuit when the measurement result is within a power fault determination voltage range including the positive electrode potential, and determines that an earth fault has occurred in the circuit when the measurement result is within an earth fault determination voltage range including the negative electrode potential.

Further, a diagnosis method for a field winding type rotating electric machine according to the present invention is used in the diagnosis apparatus for a field winding type rotating electric machine according to the present invention, and includes the steps of using the diagnosis circuit to determine, in the fault diagnosis condition on the basis of the measurement result of the voltage value of the circuit including the field winding in the fault diagnosis condition, that the disconnection has occurred in the circuit when the measurement result is within the open fault determination voltage range including the open fault determination potential, that the power fault has occurred in the circuit when the measurement result is within the power fault determination voltage range including the positive electrode potential, and that the earth fault has occurred in the circuit when the measurement result is within the earth fault determination voltage range including the negative electrode potential.

Advantageous Effects of Invention

According to the present invention, the open fault determination potential generated by the internal power supply circuit is provided in addition to the positive electrode potential and the negative electrode potential of the direct current power supply as a potential used to determine a fault, and therefore, when a part of the field winding is disconnected, the voltage of the field winding in the fault diagnosis condition becomes substantially equal to the open fault determination potential. Further, a constant current value of a constant current circuit through which a very small constant current flows to the field winding and a resistance value of a resistor connected to the field winding are set appropriately. As a result, a diagnosis apparatus for a field winding type rotating electric machine and a diagnosis method for a field winding type rotating electric machine, with which a power fault and an earth fault can be distinguished from an open fault when determining the cause of a fault in a field circuit that includes a field driving circuit and a field winding, and with which erroneous detection of a power fault and an earth fault can be suppressed even when a leak current exists between a direct current power supply and the field winding, can be obtained.

DESCRIPTION OF EMBODIMENTS

Figure 1:
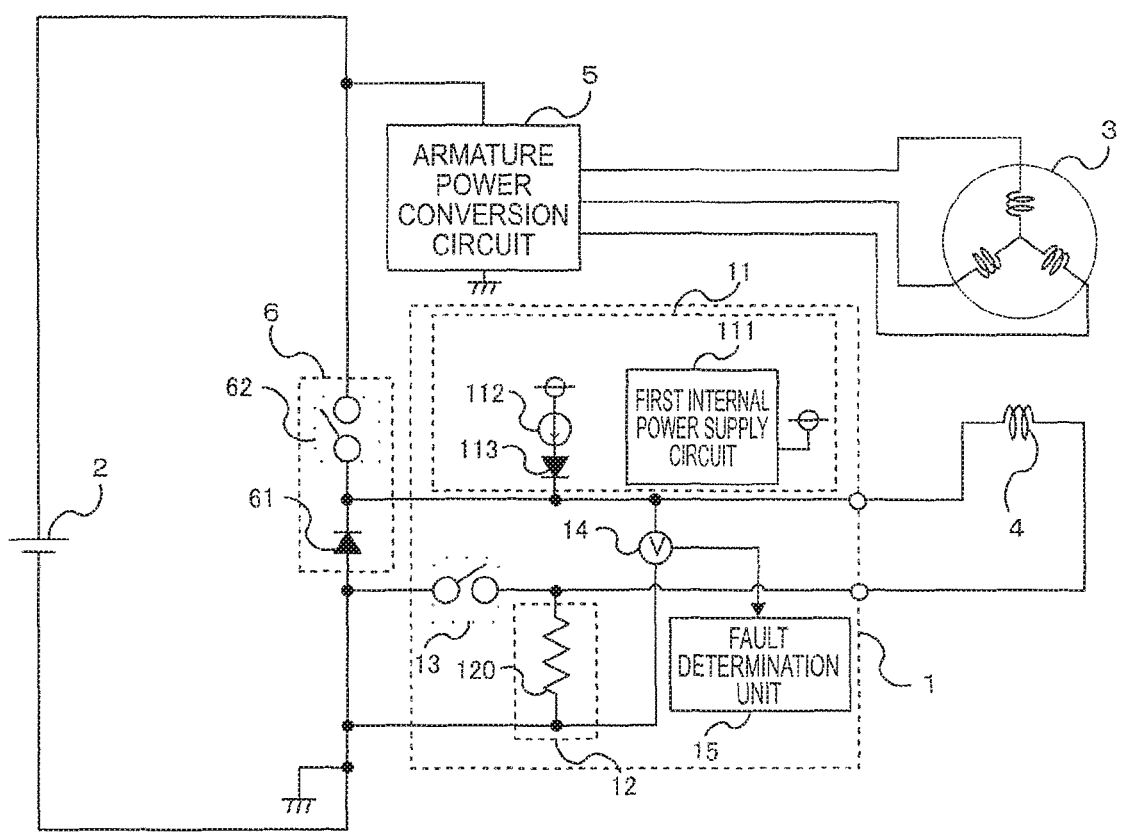
FIG. 1 is a view showing a first example of a configuration of a diagnosis apparatus for a field winding type rotating electric machine according to a first embodiment of the present invention.

Preferred embodiments of a diagnosis apparatus for a field winding type rotating electric machine and a diagnosis method for a field winding type rotating electric machine according to the present invention will be described below using the drawings. Note that identical or corresponding parts in the drawings will be described using identical reference symbols.

First Embodiment

FIG. 1 is a view showing a first example of a configuration of a diagnosis apparatus 1 for a field winding type rotating electric machine according to a first embodiment of the present invention.

The field winding type rotating electric machine shown in FIG. 1 is configured to include a chargeable and dischargeable direct current power supply 2, an armature winding 3 of an armature used in a motor or a power generator, a field winding 4 of a field magnet that interacts with the armature winding 3 via a magnetic field, an armature power conversion circuit 5 that drives the armature winding 3, and a field driving circuit 6 that drives the field winding 4.

The armature power conversion circuit 5 and the field driving circuit 6 are respectively connected to the direct current power supply 2 in parallel. Further, the field driving circuit 6 is configured such that a PWM switching element 62 and a recirculating element 61 are connected thereto in series, while the PWM switching element 62 is connected to a positive electrode side end portion of the recirculating element 61. Furthermore, the field winding 4 is connected in parallel to the recirculating element 61.

The direct current power supply 2 can be charged and discharged so as to supply direct current power to the armature power conversion circuit 5 and the field driving circuit 6 that are connected thereto in parallel. Further, the direct current power supply 2 can be charged with direct current power supplied from the armature power conversion circuit 5.

The armature power conversion circuit 5 drives the armature winding 3 by converting direct current power generated by the direct current power supply 2 into an alternating current, and converts alternating current electromotive force generated by a rotary motion of the armature winding 3 into a direct current, and supplies the direct current to the direct current power supply 2. Furthermore, the field driving circuit 6 drives the field winding 4 by performing PWM control on the direct current power from the direct current power supply 2.

Further, the diagnosis apparatus 1 for a field winding type rotating electric machine shown in FIG. 1 is configured to include a first diagnosis circuit 11, a second diagnosis circuit 12, a diagnosis switching element 13, a voltage measurement unit 14, and a fault determination unit 15.

The first diagnosis circuit 11 is connected to a positive electrode side end portion of the field winding 4. Further, the second diagnosis circuit 12 is connected to a negative electrode side end portion of the field winding 4. Specific configurations and functions of the first diagnosis circuit 11 and the second diagnosis circuit 12 will be described below.

The diagnosis switching element 13 switches a connection between respective negative electrode side end portions of the recirculating element 61 and the field winding 4 ON or OFF. The diagnosis switching element 13 is switched ON during a normal operation, and switched OFF together with the PWM switching element 62 when a diagnosis is started on the field winding type rotating electric machine.

The voltage measurement unit 14 measures a voltage of the positive electrode side end portion of the field winding 4 using a negative electrode voltage of the direct current power supply 2 as a reference. Further, the fault determination unit 15 detects a power fault (also known as a line-to-power fault), an earth fault (also known as a ground fault or a line-to-ground fault), and an open fault in a field circuit that includes the field winding 4 and the field driving circuit 6 on the basis of the measured voltage of the field winding 4, measured by the voltage measurement unit 14.

Here, the power fault occurs when insulation between a positive electrode of the direct current power supply 2 and the field circuit including the field winding 4 and the field driving circuit 6 decreases dramatically such that the positive electrode and the field circuit are electrically connected by an arc or a conductor. The power fault may occur when, for example, a (negative electrode side) wire of the field circuit short-circuits to the positive electrode (a power supply line) of the direct current power supply 2 or the like.

Further, the earth fault occurs when insulation between a negative electrode of the direct current power supply 2 and the field circuit including the field winding 4 and the field driving circuit 6 decreases dramatically such that the negative electrode and the field circuit are electrically connected by an arc or a conductor. The earth fault may occur when, for example, a (positive electrode side) wire of the field circuit short-circuits to the negative electrode (an earth line) of the direct current power supply 2 or the like.

When the power fault or the earth fault occurs, the measured voltage of the field winding 4, measured by the voltage measurement unit 14, becomes substantially equal to the positive electrode voltage or the negative electrode voltage of the direct current power supply 2. Here, substantially equal means that a potential difference between the positive electrode voltage or negative electrode voltage of the direct current power supply 2 and the voltage measured by the voltage measurement unit 14 is within a range having a fixed width including a measurement error of the voltage measurement unit 14.

Further, the open fault occurs when a part of the field winding 4 becomes disconnected. Incidentally, the conventional diagnosis apparatus 1 for a field winding type rotating electric machine described above is capable of detecting the open fault, but incapable of distinguishing the open fault from the power fault and the earth fault as the cause of the fault.

Hence, the diagnosis apparatus 1 for a field winding type rotating electric machine according to the first embodiment of the present invention is provided with a first internal power supply circuit 111 shown in FIG. 1 so as to be capable of distinguishing the open fault from the power fault and the earth fault as the cause of a fault.

More specifically, the first diagnosis circuit 11 of the diagnosis apparatus 1 shown in FIG. 1 is configured to include the first internal power supply circuit 111, an ejection type constant current circuit 112 through which a very small constant current flows from the first internal power supply circuit 111 to the field winding 4, and a first diode 113 that prevents a current from flowing in the direction of the first internal power supply circuit 111 from the field winding 4.

Further, the second diagnosis circuit 12 of the diagnosis apparatus 1 shown in FIG. 1 is configured to include a pull-down resistor 120, one end of which is connected to the negative electrode side end portion of the field winding 4 and another end of which is connected to the negative electrode of the direct current power supply 2.

By providing a positive electrode potential of the first internal power supply circuit 111 separately to the positive electrode potential and the negative electrode potential of the direct current power supply 2 as an open fault determination potential for determining a fault in this manner, the voltage of the field winding 4 in a fault diagnosis condition following disconnection of a part of the field winding 4 becomes substantially equal to the positive electrode voltage of the first internal power supply circuit 111, i.e. the open fault determination potential, and as a result, the open fault can be distinguished from the power fault and the earth fault as the cause of the fault.

The direct current power supply 2 shown in FIG. 1 is configured using, for example, a lead storage battery (a battery) used typically as a power supply for an automobile, a lithium ion battery, an electric double layer capacitor, or the like. Further, the first internal power supply circuit 111 is configured using, for example, a DC/DC converter, a series regulator, a voltage regulator diode, or the like. Moreover, the ejection type constant current circuit 112 is configured using, for example, a current regulator diode or a transistor such as a current mirror circuit.

The field driving circuit 6 is configured using, for example, a charge pump circuit, a push-pull type pre-driver that uses a drive power source generated by a bootstrap capacitor circuit, or the like. Further, the PWM switching element 62 and the diagnosis switching element 13 are configured using, for example, a power semiconductor switching element such as a MOSFET or an IGBT.

The recirculating element 61 is configured using, for example, a diode or a power semiconductor switching element such as a MOSFET, similarly to the PWM switching element 62. Here, when a MOSFET is used, a MOSFET driving circuit is provided, and by switching the MOSFET ON during recirculation, loss in the recirculating element 61 can be reduced.

The voltage measurement unit 14 is constituted by, for example, a transistor or a differential amplifier that uses an operational amplifier or the like. Further, the fault determination unit 15 is configured using, for example, a logic circuit such as a microcomputer or an ASIC, a comparator, or the like.

Next, a method of suppressing erroneous detection of an earth fault even when a leak current exists between the direct current power supply 2 and the field winding 4 by appropriately setting a constant current value of the ejection type constant current circuit 112, through which a very small constant current flows to the field winding 4, and the resistance value of the pull-down resistor 120 will be described.

First, a method of setting the resistance value of the pull-down resistor 120 will be described. The resistance value of the pull-down resistor 120 must be set such that in response to a power fault in the field winding 4 or a short-circuit fault in the PWM switching unit 62, which constitutes an upper arm of the field driving circuit 6, a voltage of a wire connection end portion of the field winding 4 increases to the positive electrode voltage of the direct current power supply 2, thereby preventing the pull-down resistor 120 from burning out even when a large current flows through the pull-down resistor 120.

More specifically, the positive electrode voltage of the direct current power supply 2 varies in accordance with a charging/discharging condition of the direct current power supply 2, and therefore, when a maximum value of a variation range of the positive electrode voltage of the direct current power supply 2 at which the field winding type rotating electric machine operates normally is set at Batt (MAX), for example, a resistance value Rpd of the pull-down resistor 120 must satisfy Equation (1), shown below.

$$Rpd > Batt(MAX)^2 / (P \times \alpha) \tag{1}$$

Here, P denotes a rated power of the pull-down resistor 120, and α denotes a safety factor such as a temperature derating factor (0.7 or 0.8, for example).

Moreover, a leak current (referred to hereafter as a first leak current I1) flowing from the positive electrode of the direct current power supply 2 to the field winding 4 via the field driving circuit 6 exists even when the PWM switching element 62 constituting the upper arm is OFF, and it is therefore necessary to avoid a situation in which the potential of the positive electrode side end portion of the pull-down resistor 120 is increased by the first leak current I1 so that the very small current used to detect a fault in the field winding 4 no longer flows.

Hence, the resistance value Rpd of the pull-down resistor 120 must also satisfy Equation (2), shown below.

$$Rpd < (Vcc - Vf) / I1 \tag{2}$$

Here, Vcc denotes the positive electrode voltage of the first internal power supply circuit 111, and Vf denotes a forward voltage drop of the first diode 113.

Next, a method of setting the constant current value of the ejection type constant current circuit 112 will be described. The leak current between the field winding 4 and the direct current power supply 2 includes a leak current (referred to hereafter as a second leak current I2) that flows from the field winding 4 to the negative electrode of the direct current power supply 2 in addition to the first leak current I1 described above, and therefore, in order to make a determination so as to distinguish the voltage of the wire connection end portion of the field winding 4 from the negative electrode voltage of the direct current power supply 2, a potential difference must be provided between the voltage of the wire connection end portion of the field winding 4 and the negative electrode voltage of the direct current power supply 2.

Hence, a constant current value Icp of the ejection type constant current circuit 112 must satisfy Equation (3), shown below.

$$Icp \geq VLg/Rpd + VLg/RLg (=I2) - I1 \tag{3}$$

Here, RLg denotes a minimum value of an envisaged leak resistance, VLg denotes a potential difference at which a determination can be made distinctively from the earth fault, and Rpd denotes the resistance value of the pull-down resistor 120.

By setting the constant current value of the ejection type constant current circuit 112 and the resistance value of the pull-down resistor 120 appropriately in this manner, erroneous detection of the earth fault can be suppressed even when a leak current exists between the direct current power supply 2 and the field winding 4. Moreover, an amount of power consumed by the pull-down resistor 120 can be suppressed.

Figure 2:
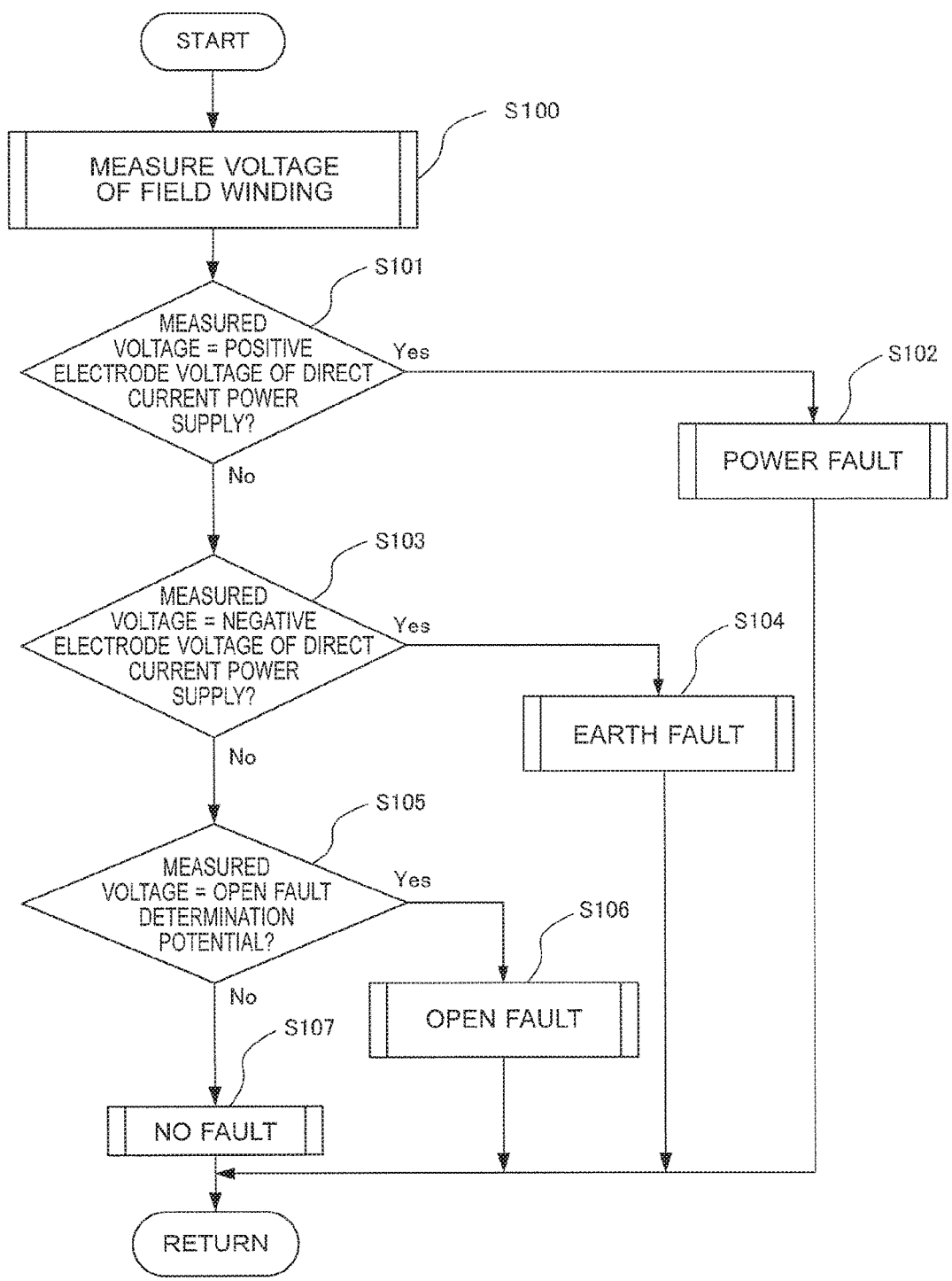
FIG. 2 is a flowchart showing a diagnosis method for a field winding type rotating electric machine according to the first embodiment of the present invention.

Next, FIG. 2 is a flowchart showing a diagnosis method for a field winding type rotating electric machine according to the first embodiment of the present invention. An operation of the fault determination unit 15 will be described below using FIG. 2.

The diagnosis method for a field winding type rotating electric machine shown in FIG. 2 is implemented in a condition (referred to hereafter as a fault diagnosis condition) where the PWM switching element 62 and the diagnosis switching element 13 are OFF, and an induced current generated by a relative rotary motion of the armature winding 3 is not flowing through the field winding 4.

In the fault diagnosis condition, the fault determination unit 15 starts to perform a fault diagnosis on the field circuit including the field winding 4 and the field driving circuit 6 after receiving a fault diagnosis start signal from a control unit (not shown) of the field winding type rotating electric machine or an upper order controller (not shown) of the field winding type rotating electric machine.

First, in step S100, the fault determination unit 15 obtains the measured voltage of the wire connection end portion of the field winding 4, measured by the voltage measurement unit 14.

Next, in step S101, the fault determination unit 15 checks whether or not the measured voltage of the circuit including the field winding 4, measured by the voltage measurement unit 14, is substantially equal to the positive electrode voltage of the direct current power supply 2 (=whether or not the measured voltage is within a power fault determination voltage range including the positive electrode potential of the direct current power supply 2). When the measured voltage is equal to the positive electrode voltage, the routine advances to step S102, where the power fault is determined to have occurred. The fault diagnosis is then terminated. When the measured voltage is not equal to the positive electrode voltage, on the other hand, the routine advances to step S103.

Next, in step S103, the fault determination unit 15 checks whether or not the measured voltage of the circuit including the field winding 4, measured by the voltage measurement unit 14, is substantially equal to the negative electrode voltage of the direct current power supply 2 (=whether or not the measured voltage is within an earth fault determination voltage range including the negative electrode potential of the direct current power supply 2). When the measured voltage is equal to the negative electrode voltage, the routine advances to step S104, where the earth fault is determined to have occurred. The fault diagnosis is then terminated. When the measured voltage is not equal to the negative electrode voltage, on the other hand, the routine advances to step S105.

Next, in step S105, the fault determination unit 15 checks whether or not the measured voltage of the circuit including the field winding 4, measured by the voltage measurement unit 14, is substantially equal to the positive electrode voltage of the first internal power supply circuit 111, i.e. the open fault determination potential for determining an open fault (=whether or not the measured voltage is within an open fault determination voltage range including the open fault determination potential). When the measured voltage is equal to the positive electrode voltage, the routine advances to step S106, where the open fault is determined to have occurred. The fault diagnosis is then terminated. When the measured voltage is not equal to the positive electrode voltage, on the other hand, the routine advances to step S107.

Next, in step S107, the fault determination unit 15 determines that none of the power fault, the earth fault, and the open fault have occurred in the field circuit including the field driving circuit 6 and the field winding 4. The fault diagnosis is then terminated.

Note that the positive electrode voltage of the direct current power supply 2 varies in accordance with the charging/discharging condition of the direct current power supply 2, and therefore, to detect the power fault correctly using the diagnosis method for a field winding type rotating electric machine shown in FIG. 2, the positive electrode voltage of the first internal power supply circuit 111 is set to be lower than a minimum value of the voltage variation range of the positive electrode voltage of the direct current power supply 2 at which the field winding type rotating electric machine operates normally.

Alternatively, a voltage regulation unit 114 may be provided in the first diagnosis circuit 11 so that the power fault can be detected correctly even when the positive electrode voltage of the first internal power supply circuit 111 is higher than the positive electrode voltage of the direct current power supply 2 at which the field winding type rotating electric machine operates normally. This method will be described below.

Figure 3:
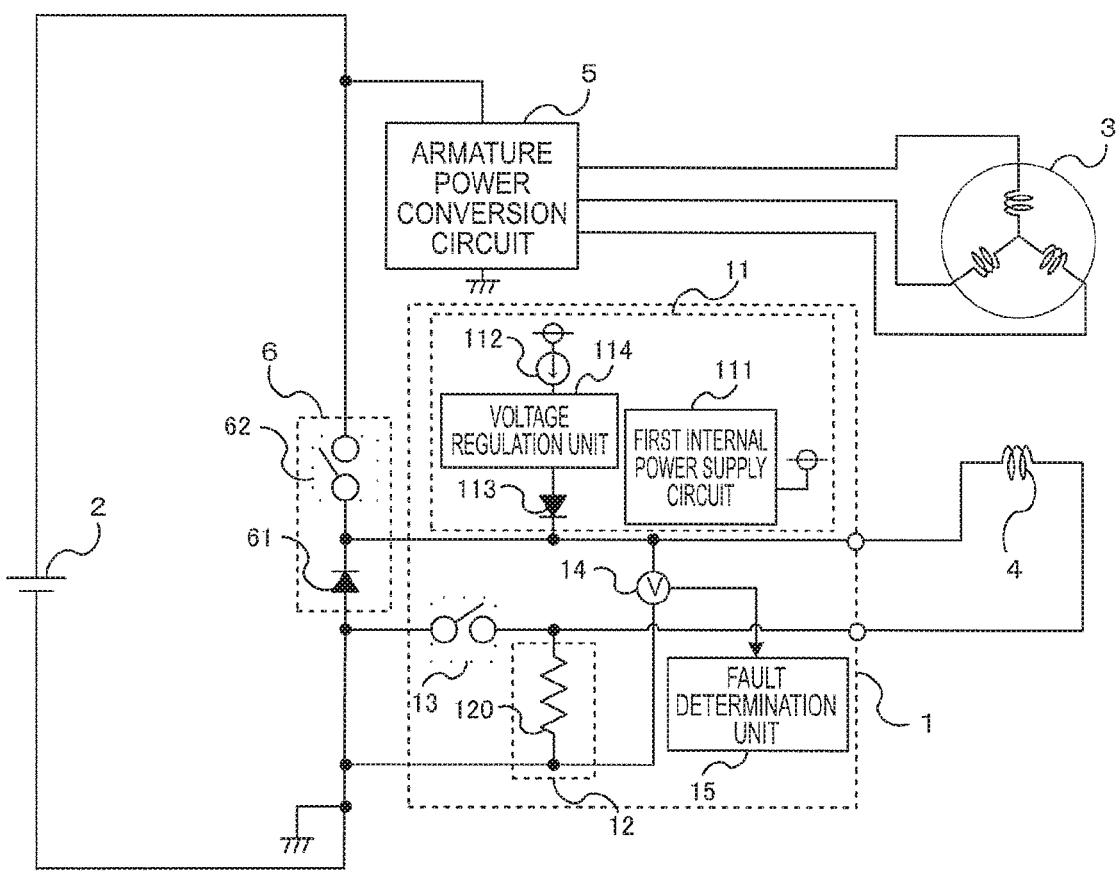
FIG. 3 is a view showing a second example of a configuration of the diagnosis apparatus for a field winding type rotating electric machine according to the first embodiment of the present invention.

FIG. 3 is a view showing a second example of a configuration of the diagnosis apparatus 1 for a field winding type rotating electric machine according to the first embodiment of the present invention. The first diagnosis circuit 11 shown in FIG. 3 differs from that of FIG. 1 in further including the voltage regulation unit 114, which is inserted in series between the ejection type constant current circuit 112 and the first diode 113.

All other configurations are identical to FIG. 1, and likewise with the diagnosis apparatus 1 configured as shown in FIG. 3, a fault can be diagnosed in the field circuit including the field winding 4 and the field driving circuit 6 by following the flowchart shown in FIG. 2.

The voltage regulation unit 114 is used to enlarge (or amplify) a potential difference between the positive electrode voltage of the first internal power supply circuit 111 and the voltage of the wire connection end portion of the field winding 4. The voltage regulation unit 114 is configured using, for example, a voltage regulator diode, a cathode side of which is connected to the positive electrode side of the first internal power supply circuit 111. Alternatively, the voltage regulation unit 114 may be configured from one or more diodes, anode sides of which are connected to the positive electrode side of the first internal power supply circuit 111 using a forward voltage drop of the diodes.

As shown in FIG. 3, by inserting the voltage regulation unit 114 between the first internal power supply circuit 111 of the first diagnosis circuit 11 and the field winding 4, the voltage of the wire connection end portion of the field winding 4 in the fault diagnosis condition can be pulled down. In other words, inserting the voltage regulation unit 114 in the first diagnosis circuit 11 is equivalent in terms of a circuit to resetting the positive electrode voltage of the first internal power supply circuit 111 to be lower by an amount corresponding to a voltage drop generated by the voltage regulation unit 114.

Hence, even when the positive electrode voltage of the first internal power supply circuit 111 is higher than the positive electrode voltage of the direct current power supply 2, an equivalent effect to that of a circuit on which the positive electrode voltage of the first internal power supply circuit 111 is set to be lower than the positive electrode voltage of the direct current power supply 2 can be realized by inserting the voltage regulation unit 114, which has a larger voltage drop than the potential difference between the respective positive electrode voltages, in the first diagnosis circuit 11.

Note that in the configuration shown in FIG. 3, in which the voltage regulation unit 114 is provided, Equation (2), which must be satisfied by the pull-down resistor 120, is replaced by Equation (4), shown below, in which Vzd denotes the voltage drop generated by the voltage regulation unit 114.

$$Rpd < (Vcc - Vf - Vzd)/I1 \qquad (4)$$

Figure 4:
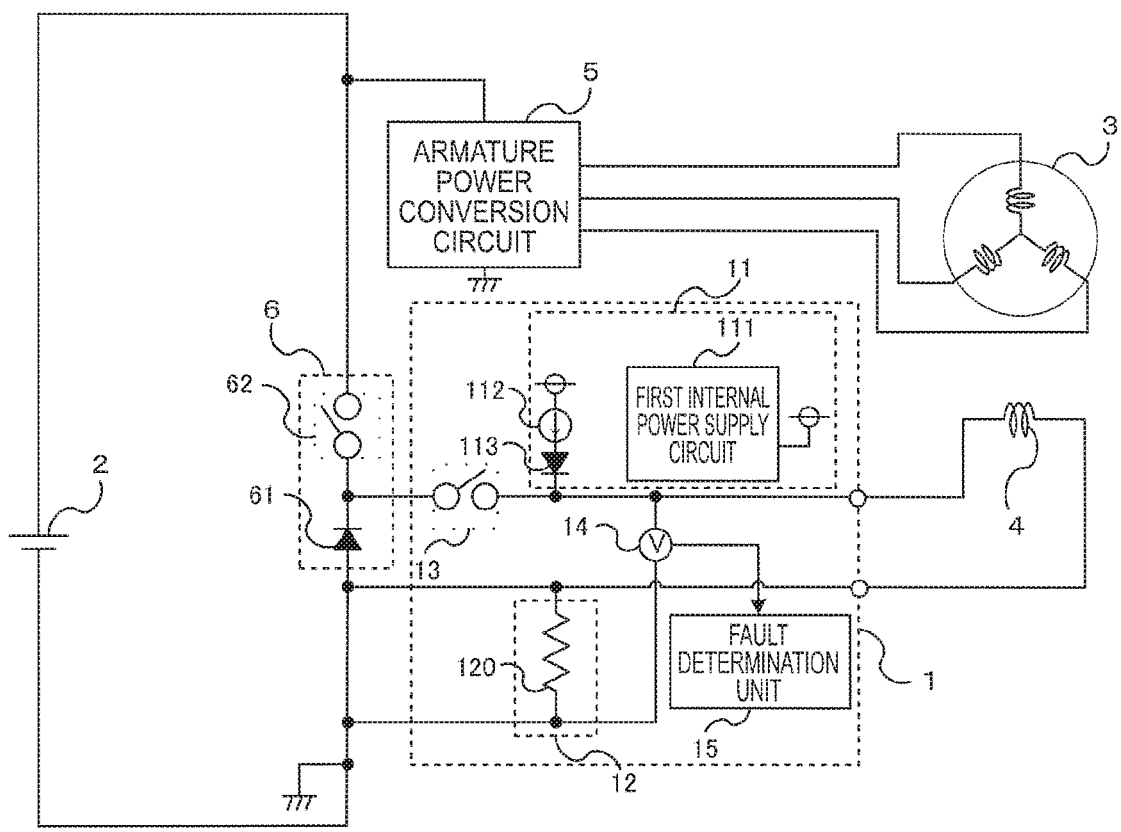
FIG. 4 is a view showing a third example of a configuration of the diagnosis apparatus for a field winding type rotating electric machine according to the first embodiment of the present invention.

Furthermore, FIG. 4 is a view showing a third example of a configuration of the diagnosis apparatus 1 for a field winding type rotating electric machine according to the first embodiment of the present invention. The diagnosis apparatus 1 shown in FIG. 4 differs from that of FIG. 1 in that the PWM switching element 62 is connected to the negative electrode side end portion, rather than the positive electrode side end portion, of the recirculating element 61. Moreover, the diagnosis switching element 13 switches a connection between the respective positive electrode side end portions, rather than the respective negative electrode side end portions, of the recirculating element 61 and the field winding 4 ON or OFF.

All other configurations are identical to FIG. 1, and likewise with the diagnosis apparatus 1 configured as shown in FIG. 4, a fault can be diagnosed in the field circuit including the field winding 4 and the field driving circuit 6 by following the flowchart shown in FIG. 2.

In the configuration shown in FIG. 4, when the recirculating element 61 is a diode, the recirculating element 61 constituting the upper arm does not require a drive circuit, and therefore the first leak current I1 flowing from the positive electrode of the direct current power supply 2 to the field winding 4 via the field driving circuit 6 is not generated. Hence, Equation (2) does not need to be taken into account, and therefore the pull-down resistor 120 only needs to satisfy the condition of Equation (1). As a result, the conditions to be satisfied by the pull-down resistor 120 can be relaxed.

According to the first embodiment, as described above, the open fault determination potential generated by the first internal power supply circuit is provided as a potential for determining a fault in addition to the positive electrode potential and the negative electrode potential of the direct current power supply, and therefore, when a part of the field winding is disconnected, the measured voltage of the field winding in the fault diagnosis condition becomes substantially equal to the open fault determination potential. Furthermore, the constant current value of the ejection type constant current circuit through which a very small constant current flows to the field winding and the resistance value of the pull-down resistor connected to the negative electrode side end portion of the field winding are set appropriately, as shown in Equations (1) to (4).

As a result, a diagnosis apparatus for a field winding type rotating electric machine and a diagnosis method for a field winding type rotating electric machine, with which the power fault and the earth fault can be distinguished from the open fault when determining the cause of a fault in the field circuit including the field driving circuit and the field winding, and with which erroneous detection of the earth fault can be suppressed even when a leak current exists between the direct current power supply and the field winding, can be obtained.

Moreover, the power consumption of the pull-down resistor can be suppressed, and since the pull-down resistor does not burn out even when the voltage of the wire connection end portion of the field winding increases to the positive electrode voltage of the direct current power supply due to the power fault, a secondary fault can be prevented.

Furthermore, by setting the positive electrode voltage of the first internal power supply circuit to be lower than the minimum value of the voltage variation range of the positive electrode voltage of the direct current power supply at which the field winding type rotating electric machine operates normally, the power fault can be detected correctly.

Alternatively, as shown in FIG. 3, the voltage of the wire connection end portion of the field winding can be pulled down by providing the voltage regulation unit so that the power fault can be detected correctly even when the positive electrode voltage of the direct current power supply is lower than the value of the positive electrode voltage of the first internal power supply circuit.

Moreover, as shown in FIG. 4, a configuration in which the PWM switching element is connected to the negative electrode side end portion of the recirculating element so that the diagnosis switching element switches the connection between the respective positive electrode side end portions of the recirculating element and the field winding ON or OFF may be employed. By employing this configuration, when the recirculating element is a diode, the recirculating element constituting the upper arm does not require a drive circuit, and therefore the first leak current I1 is not generated. As a result, the conditions to be satisfied by the pull-down resistor can be relaxed.

Second Embodiment

In the first embodiment, a method with which erroneous detection of the earth fault can be suppressed even when a leak current exists between the direct current power supply 2 and the field winding 4 by providing the ejection type constant current circuit 112 in the diagnosis apparatus 1 and setting the constant current of the ejection type constant current circuit 112 appropriately was described. In a second embodiment, a method with which the constant current value of the ejection type constant current circuit 112 and the resistance value of the pull-down resistor 120 can be set appropriately even when contact resistance generated by an oxide film of a brush exists in the field winding 4 will be described.

The field winding 4 realizes electric contact via a brush, and therefore, when the current flowing through the field winding 4 is small, contact resistance generated by an oxide film of the brush increases. Hence, to suppress erroneous detection of the power fault and the earth fault when a leak current exists between the direct current power supply 2 and the field winding 4, Equations (1) to (4), set in the first embodiment to express the conditions to be satisfied by the ejection type constant current circuit 112 and the pull-down resistor 120, must be corrected in consideration of the contact resistance of the field winding 4.

A method of correcting the equations expressing the conditions to be satisfied by the ejection type constant current circuit 112 and the pull-down resistor 120 in consideration of the contact resistance of the field winding 4 will be described below using FIG. 5.

Figure 5:
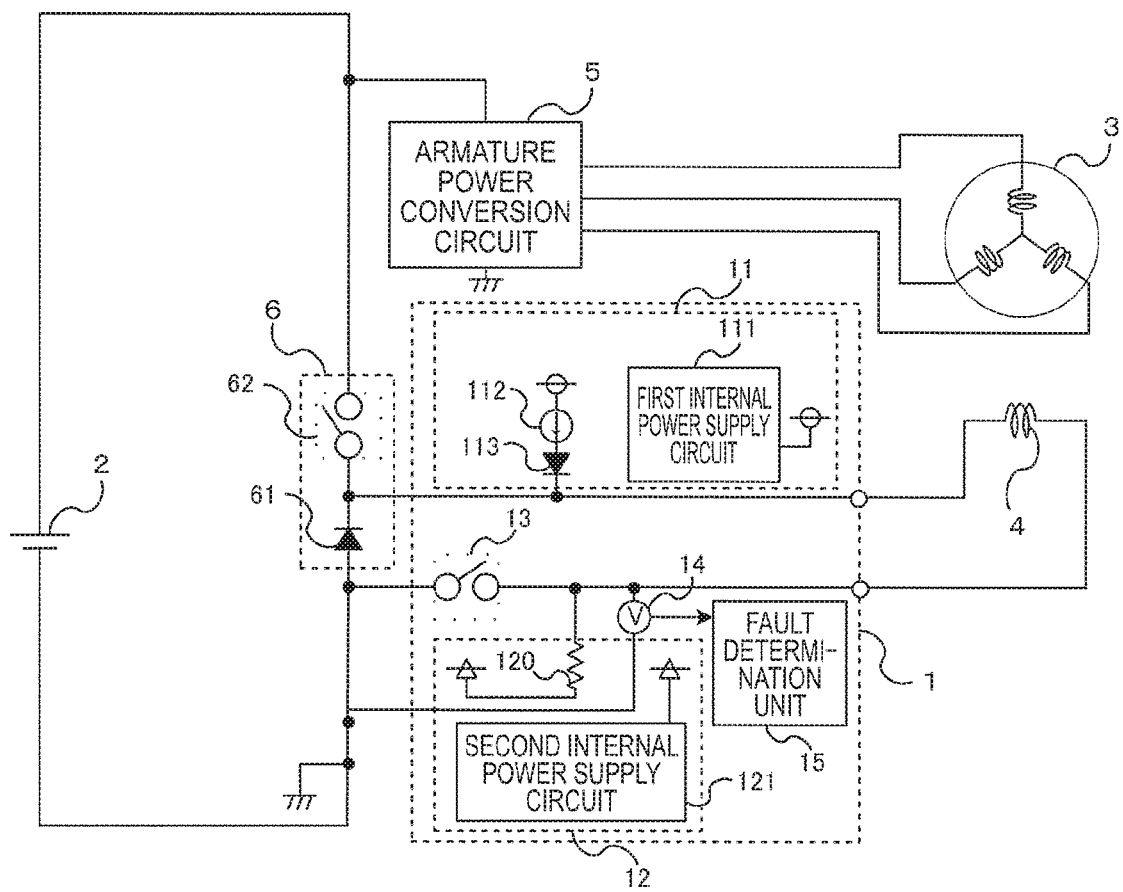
FIG. 5 is a view showing an example of a configuration of a diagnosis apparatus for a field winding type rotating electric machine according to a second embodiment of the present invention.

FIG. 5 is a view showing an example of a configuration of the diagnosis apparatus 1 for a field winding type rotating electric machine according to the second embodiment of the present invention. The second diagnosis circuit 12 of the diagnosis apparatus 1 shown in FIG. 5 differs from that of FIG. 1 in including a second internal power supply circuit 121 and a pull-down resistor 120 that pulls down the voltage of the negative electrode side end portion of the field winding 4 to a positive electrode voltage of the second internal power supply circuit 121.

Further, the voltage measurement unit 14 shown in FIG. 5 measures the voltage of the negative electrode side end portion of the field winding 4 rather than the positive electrode side end portion of the field winding 4.

All other configurations are identical to FIG. 1, and likewise with the diagnosis apparatus 1 configured as shown in FIG. 5, a fault can be diagnosed in the field circuit including the field winding 4 and the field driving circuit 6 by following the flowchart shown in FIG. 2. Note, however, that in step S105 of FIG. 2, the open fault determination potential must be set at the positive electrode voltage of the second internal power supply circuit 121 instead of the positive electrode voltage of the first internal power supply circuit 111.

In FIG. 5, the reason for connecting the voltage measurement unit 14 to the negative electrode side end portion of the field winding 4 rather than the positive electrode side end portion of the field winding 4 is to solve a problem that occurs with the configuration shown in FIG. 1, according to which the voltage of the positive electrode side end portion of the field winding 4 does not become substantially equal to the negative electrode voltage of the direct current power supply 2 when the earth fault occurs in a case where the field winding 4 exhibits contact resistance, making it impossible to detect the earth fault.

As shown in FIG. 5, by connecting the voltage measurement unit 14 to the negative electrode side end portion of the field winding 4, the earth fault can be detected even when the field winding 4 exhibits contact resistance. Conversely, however, the voltage of the negative electrode side end portion of the field winding 4 during a fault diagnosis no longer becomes substantially equal to the positive electrode voltage of the first internal power supply circuit 111, i.e. the open fault determination potential, and as a result, the open fault can no longer be detected.

Hence, by providing the diagnosis apparatus 1 for a field winding type rotating electric machine according to the second embodiment with the second internal power supply circuit 121 and the pull-down resistor 120, the positive electrode voltage of the second internal power supply circuit 121 can be used as the open fault determination potential, and as a result, the open fault can be detected.

The second internal power supply circuit 121, similarly to the first internal power supply circuit 111, is configured using, for example, a DC/DC converter, a series regulator, a voltage regulator diode, or the like. Moreover, the positive electrode voltage of the second internal power supply circuit 121 is set to be sufficiently smaller than the positive electrode voltage of the first internal power supply circuit 111. For example, a method of setting the positive electrode voltage of the second internal power supply circuit 121 at one tenth of the positive electrode voltage of the first internal power supply circuit 111 may be considered.

Further, a current capacity of the second internal power supply circuit 121 must be set such that when the maximum value of the variation range of the positive electrode voltage of the direct current power supply 2 at which the field winding type rotating electric machine operates normally is applied to the wire connection end portion of the field winding 4, the second internal power supply circuit 121 is capable of sinking the amount of current flowing through the pull-down resistor 120.

When the field winding 4 exhibits contact resistance, Equations (1) to (4), set in the first embodiment to express the conditions to be satisfied by the ejection type constant current circuit 112 and the pull-down resistor 120, are replaced respectively by Equations (5) to (8), shown below.

$$Rpd > (Batt(MAX) - Vccs)^2 / (P \times \alpha) \quad (5)$$

$$Rpd < (Vcc - Vf - Vccs) / I1 - Rb \quad (6)$$

$$Icp \geq VLg/RLg + (VLg - Vccs)/Rpd - I1 + Rb(VLg - Vccs)/RLg/Rpd \quad (7)$$

$$Rpd < (Vcc - Vf - Vccs - Vzd)/I1 - Rb \quad (8)$$

Here, Vccs denotes the positive electrode voltage of the second internal power supply circuit 121, and Rb denotes an envisaged contact resistance value generated by the oxide film of the brush.

According to the second embodiment, as described above, the second diagnosis circuit is configured to include the second internal power supply circuit and the pull-down resistor that pulls down the voltage of the negative electrode side end portion of the field winding to the positive electrode voltage of the second internal power supply circuit, and the voltage measurement unit is configured to measure the voltage of the negative electrode side end portion of the field winding. Further, the constant current value of the ejection type constant current circuit and the resistance value of the pull-down resistor are set appropriately.

As a result, erroneous detection of the power fault and the earth fault can be suppressed both when a leak current exists between the direct current power supply and the field winding and when contact resistance generated by the oxide film of the brush exists in the field winding.

Third Embodiment

In the first embodiment, a method with which erroneous detection of the earth fault can be suppressed even when a leak current exists between the direct current power supply 2 and the field winding 4 by providing the ejection type constant current circuit 112 in the diagnosis apparatus 1 and setting the constant current of the ejection type constant current circuit 112 appropriately was described. In a third embodiment, a method with which erroneous detection of the power fault can be suppressed even when a leak current exists between the direct current power supply 2 and the field winding 4 by providing a sink type constant current circuit 122 instead of the ejection type constant current circuit 112 and setting a constant current of the sink type constant current circuit 122 appropriately will be described.

Figure 6:
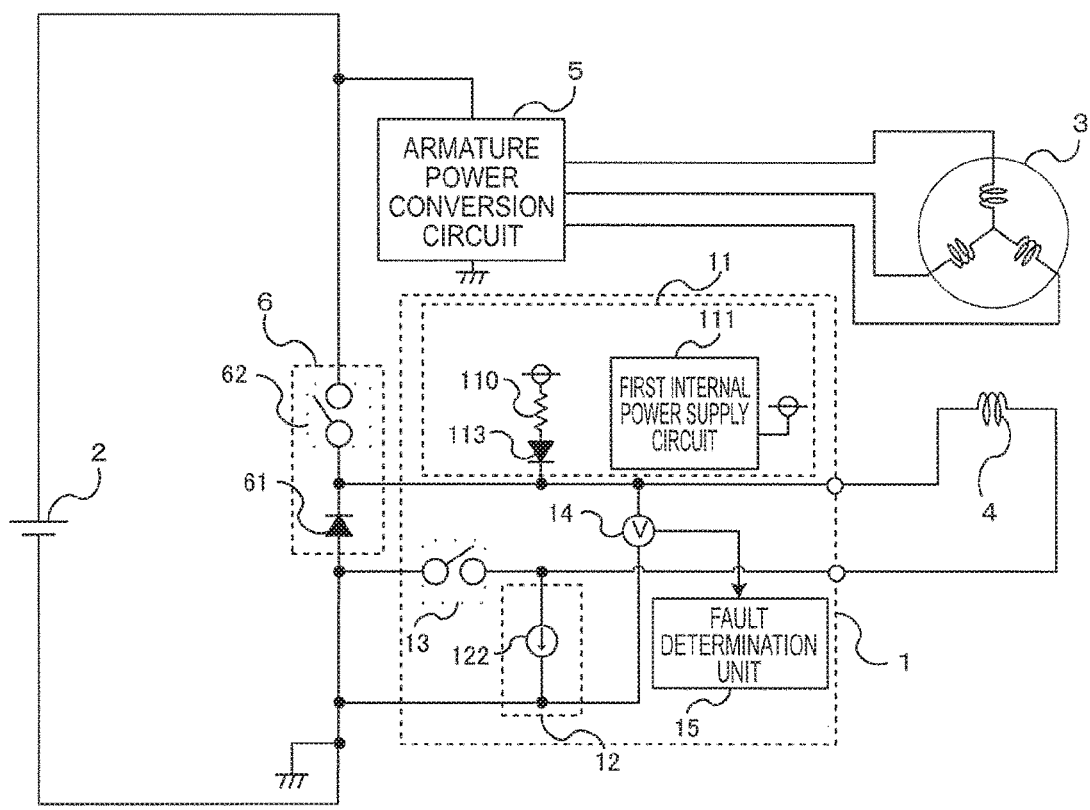
FIG. 6 is a view showing an example of a configuration of a diagnosis apparatus for a field winding type rotating electric machine according to a third embodiment of the present invention.

FIG. 6 is a view showing an example of a configuration of the diagnosis apparatus 1 for a field winding type rotating electric machine according to the third embodiment of the present invention. The first diagnosis circuit 11 of the diagnosis apparatus 1 shown in FIG. 6 differs from that of FIG. 1 in including a pull-up resistor 110 instead of the ejection type constant current circuit 112. Further, the second diagnosis circuit 12 of the diagnosis apparatus 1 shown in FIG. 1 in including the sink type constant current circuit 122 in place of the pull-down resistor 120.

All other configurations are identical to FIG. 1, and likewise with the diagnosis apparatus 1 configured as shown in FIG. 6, a fault can be diagnosed in the field circuit including the field winding 4 and the field driving circuit 6 by following the flowchart shown in FIG. 2.

Note that FIG. 6 shows an example in which the second diagnosis circuit 12 including the sink type constant current circuit 122 is connected to the negative electrode side end portion of the field winding 4, but the second diagnosis circuit 12 may be connected to the positive electrode side end portion of the field winding 4. In this case, the first diagnosis circuit 11 is connected to the negative electrode side end portion of the field winding 4.

The sink type constant current circuit 122, similarly to the ejection type constant current circuit 112 shown in FIG. 1, is configured using, for example, a current regulator diode or a transistor such as a current mirror circuit.

First, a method of setting the constant current value of the sink type constant current circuit 122 will be described. Similarly to the ejection type constant current circuit 112 described above, the constant current value of the sink type constant current circuit 122 must be set at a large enough potential difference to be able to make a determination so as to distinguish the voltage of the wire connection end portion of the field winding 4 from the positive electrode voltage of the direct current power supply 2 when a leak current (referred to hereafter as a third leak current I3) flowing from the field winding 4 to the direct current power supply 2 exists.

Here, when the voltage of the wire connection end portion of the field winding 4 in a condition where the third leak current I3 exists is larger than the voltage of the wire connection end portion of the field winding 4 in a condition where no fault has occurred, no current flows from the first internal power supply circuit 111, and therefore the constant current value of the sink type constant current circuit 122 can be set easily.

Accordingly, a constant current value Icd of the sink type constant current circuit 122 must satisfy Equation (9), shown below.

$$Icd \leq (Batt(MIN) - VFHS)/RLt(=I3) + I1 \quad (9)$$

Here, in the fault diagnosis condition, the voltage of the wire connection end portion of the field winding 4 when no fault has occurred is set at VFHS, the minimum value of the voltage variation range of the direct current power supply 2 at which the field winding type rotating electric machine operates normally is set at Batt (MIN), and a minimum value of an envisaged leak resistance when the third leak current I3 exists is set at RLt.

Further, the first leak current I1 that flows from the positive electrode of the direct current power supply 2 to the field winding 4 via the field driving circuit 6 exists even when the PWM switching element 62 constituting the upper arm is OFF, and therefore the constant current value of the sink type constant current circuit 122 must be set to be at least larger than the first leak current I1.

When the constant current value is not set in this manner, the first leak current I11 flows out through a body diode of the PWM switching element 62 into the direct current power supply 2 such that the voltage of the wire connection end portion of the field winding 4 reaches or exceeds the positive electrode voltage of the direct current power supply 2, and as a result, the fault determination unit 15 detects the power fault erroneously.

Hence, by adding the first leak current I1 to the constant current value calculated from a potential difference VLt required when a leak occurs into the positive electrode voltage of the direct current power supply 2 and the minimum value RLt of the envisaged leak resistance, a condition to be satisfied by the constant current value Icd is expressed by Equation (10), shown below.

$$Icd \geq VLt/RLt + I1 \qquad (10)$$

Next, a method of setting a resistance value of the pull-up resistor 110 will be described. The pull-up resistor 110 functions in a similar manner to the voltage regulation unit 114 shown in FIG. 3 to pull down the voltage of the wire connection end portion of the field winding 4 in a condition where no fault has occurred. A resistance value Rpu of the pull-up resistor 110 must therefore satisfy Equation (11), shown below.

$$Rpu \geq (Vcc - Vf - VFHS)/(Icd - I1) \qquad (11)$$

Here, VFHS denotes the voltage of the wire connection end portion of the field winding 4 in a condition where no fault has occurred, Vcc denotes the positive electrode voltage of the first internal power supply circuit 111, Vf denotes the forward voltage drop of the first diode 113, and Icd denotes the constant current value of the sink type constant current circuit 122.

Further, the current flowing through the pull-up resistor 110 reaches a maximum when an earth fault occurs in the wire connection end portion of the field winding 4, and therefore a rated power of the pull-up resistor 110 must be able to withstand this current.

Hence, the resistance value Rpu of the pull-up resistor 110 must satisfy Equation (12), shown below.

$$Rpu > (Vcc - Vf)^2/(P \times \alpha) \qquad (12)$$

Here, P denotes a rated power of the pull-up resistor 110, α denotes a safety factor such as a temperature derating factor (0.7 or 0.8, for example), Vcc denotes the positive electrode voltage of the first internal power supply circuit 111, and Vf denotes the forward voltage drop of the first diode 113.

Moreover, to ensure that the fault determination unit 15 does not detect the earth fault erroneously, the resistance value of the pull-up resistor 110 must satisfy Equations (11) and (12), and must also satisfy Equation (13), shown below, in relation to the envisaged minimum value of the leak resistance flowing from the field winding 4 into the negative electrode voltage of the direct current power supply 2.

$$Rpu \leq (Vcc - Vf - VLg)/(Icd - I1 + VLg/RLg) \qquad (13)$$

Here, RLg denotes the envisaged minimum value of the leak resistance, VLg denotes a potential difference required to avoid erroneous detection of the earth fault when leakage occurs into the negative electrode voltage of the direct current power supply 2, Vcc denotes the positive electrode voltage of the first internal power supply circuit 111, Vf denotes the forward voltage drop of the first diode 113, and Icd denotes the constant current value of the sink type constant current circuit 122.

According to the third embodiment, as described above, the sink type constant current circuit is provided in place of the ejection type constant current circuit, while the constant current of the sink type constant current circuit and the resistance value of the pull-up resistor connected to the positive electrode side end portion of the field winding are set appropriately.

As a result, a diagnosis apparatus for a field winding type rotating electric machine and a diagnosis method for a field winding type rotating electric machine, with which the power fault and the earth fault can be distinguished from the open fault when determining the cause of a fault in the field circuit that includes the field driving circuit and the field winding, and with which erroneous detection of the power fault can be suppressed even when a leak current exists between the direct current power supply and the field winding, can be obtained.

Moreover, the power consumption of the pull-up resistor can be suppressed, and since the pull-up resistor does not burn out even when the voltage of the wire connection end portion of the field winding decreases to the negative electrode voltage of the direct current power supply due to the earth fault, a secondary fault can be prevented. Furthermore, the power fault can be detected correctly even when the positive electrode voltage of the direct current power supply is lower than the positive electrode voltage of the first internal power supply circuit.

Fourth Embodiment

In the first embodiment, a method with which erroneous detection of the earth fault can be suppressed even when a leak current exists between the direct current power supply 2 and the field winding 4 by providing the ejection type constant current circuit 112 in the diagnosis apparatus 1 and setting the constant current of the ejection type constant current circuit 112 appropriately was described. Further, in the third embodiment, a method with which erroneous detection of the power fault can be suppressed even when a leak current exists between the direct current power supply 2 and the field winding 4 by providing the sink type constant current circuit 122 in place of the ejection type constant current circuit 112 and setting the constant current of the sink type constant current circuit 122 appropriately was described. In a fourth embodiment, on the other hand, a method with which erroneous detection of the earth fault and the power fault can be suppressed even when a leak current exists between the direct current power supply 2 and the field winding 4 by providing both the ejection type constant current circuit 112 and the sink type constant current circuit 122 in the diagnosis apparatus 1 will be described.

Figure 7:
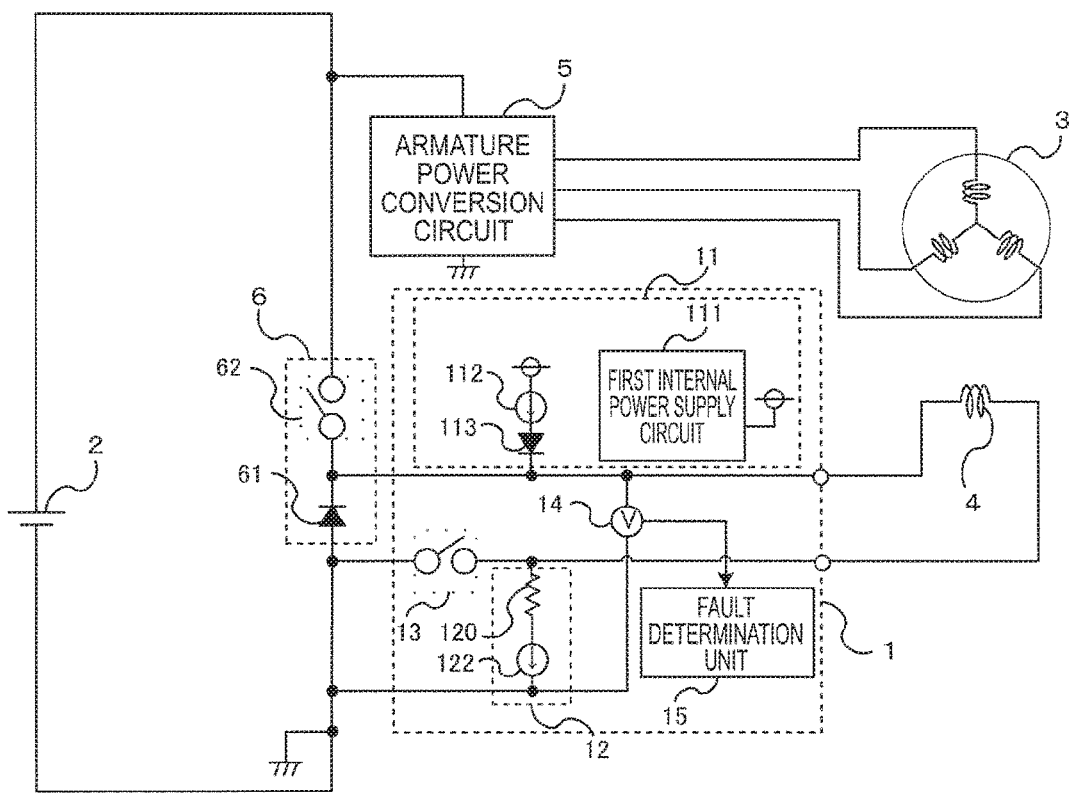
FIG. 7 is a view showing an example of a configuration of a diagnosis apparatus for a field winding type rotating electric machine according to a fourth embodiment of the present invention.

FIG. 7 is a view showing an example of a configuration of the diagnosis apparatus 1 for a field winding type rotating electric machine according to the fourth embodiment of the present invention. The second diagnosis circuit 12 of the diagnosis apparatus 1 shown in FIG. 7 differs from that of FIG. 1 in further including the sink type constant current circuit 122, which is inserted in series between the pull-down resistor 120 and the negative electrode of the direct current power supply 2.

All other configurations are identical to FIG. 1, and likewise with the diagnosis apparatus 1 configured as shown in FIG. 7, a fault can be diagnosed in the field circuit including the field winding 4 and the field driving circuit 6 by following the flowchart shown in FIG. 2.

In the diagnosis apparatus 1 configured as shown in FIG. 7, Equation (3) can be applied as is to the set value of the constant current value of the ejection type constant current circuit 112. Further, Equation (10) can be applied as is to the set value of the constant current value of the sink type constant current circuit 122.

As a result, erroneous detection of the earth fault and the power fault can be suppressed even when the second leak current I2 flowing from the field winding 4 to the negative electrode of the direct current power supply 2 and the third leak current I3 flowing from the field winding 4 to the positive electrode of the direct current power supply 2 both exist.

The pull-down resistor 120 functions in a similar manner to the voltage regulation unit 114 shown in FIG. 3 to pull up the voltage of the wire connection end portion of the field winding 4 in a condition where no fault has occurred.

In other words, in the fault diagnosis condition, the voltage of the wire connection end portion of the field winding 4 in a condition where no fault has occurred is set at VFHS, the constant current value of the sink type constant current circuit 122 is set at Icd, and the resistance value Rpd of the pull-down resistor 120 takes a value satisfying Equation (14), shown below.

$$Rpd > VFHS/Icd \tag{14}$$

Further, to ensure that a current flowing to the sink type constant current circuit 122 is not restricted when the second leak current I2 is generated so as to flow from the field winding 4 to the negative electrode of the direct current power supply 2, the resistance value Rpd of the pull-down resistor 120 must satisfy Equation (15), shown below.

$$Rpd < Batt(MIN)/Icd - RLt \tag{15}$$

Here, Batt (MIN) denotes the minimum value of the voltage variation range of the direct current power supply 2 at which the field winding type rotating electric machine operates normally, Icd denotes the constant current value of the sink type constant current circuit 122, and RLt denotes the minimum value of the envisaged leak resistance when the third leak current I3 exists.

Furthermore, the resistance value of the pull-down resistor 120 must be set to ensure that the pull-down resistor 120 does not burn out even when the constant current of the sink type constant current circuit 122 flows continuously. More specifically, for example, when the rated power of the pull-down resistor 120 is set at P, a safety factor such as a temperature derating factor (0.7 or 0.8, for example) is set at α, and the constant current value of the sink type constant current circuit 122 is set at Icd, the resistance value Rpd of the pull-down resistor 120 must satisfy Equation (16), shown below.

$$Rpd < P \times \alpha / Icd^2 \tag{16}$$

According to the fourth embodiment, as described above, the ejection type constant current circuit and the sink type constant current circuit are both provided in the diagnosis apparatus, while the respective constant currents of the ejection type constant current circuit and the sink type constant current circuit and the resistance value of the pull-down resistor connected to the wire connection end portion of the field winding are set appropriately.

As a result, a diagnosis apparatus for a field winding type rotating electric machine and a diagnosis method for a field winding type rotating electric machine, with which the power fault and the earth fault can be distinguished from the open fault when determining the cause of a fault in the field circuit that includes the field driving circuit and the field winding, and with which erroneous detection of the earth fault and the power fault can be suppressed even when a leak current exists between a direct current power supply and the field winding, can be obtained.

Moreover, the power consumption of the pull-down resistor can be suppressed, and since the pull-down resistor does not burn out even when the wire connection end portion of the field winding short-circuits to the positive electrode or the negative electrode of the direct current power supply, a secondary fault can be prevented. Furthermore, the power fault can be detected correctly even when the positive electrode voltage of the direct current power supply is lower than the positive electrode voltage of the first internal power supply circuit.

Fifth Embodiment

In the first to fourth embodiments, methods of diagnosing the power fault, the earth fault, and the open fault in the field circuit including the field winding 4 and the field driving circuit 6 were described. In a fifth embodiment, a further method of diagnosing a breakdown in the power semiconductor switching element, such as a MOSFET, used as the PWM switching element 62, the diagnosis switching element 13, or the recirculating element 61 will be described.

Figure 8A:
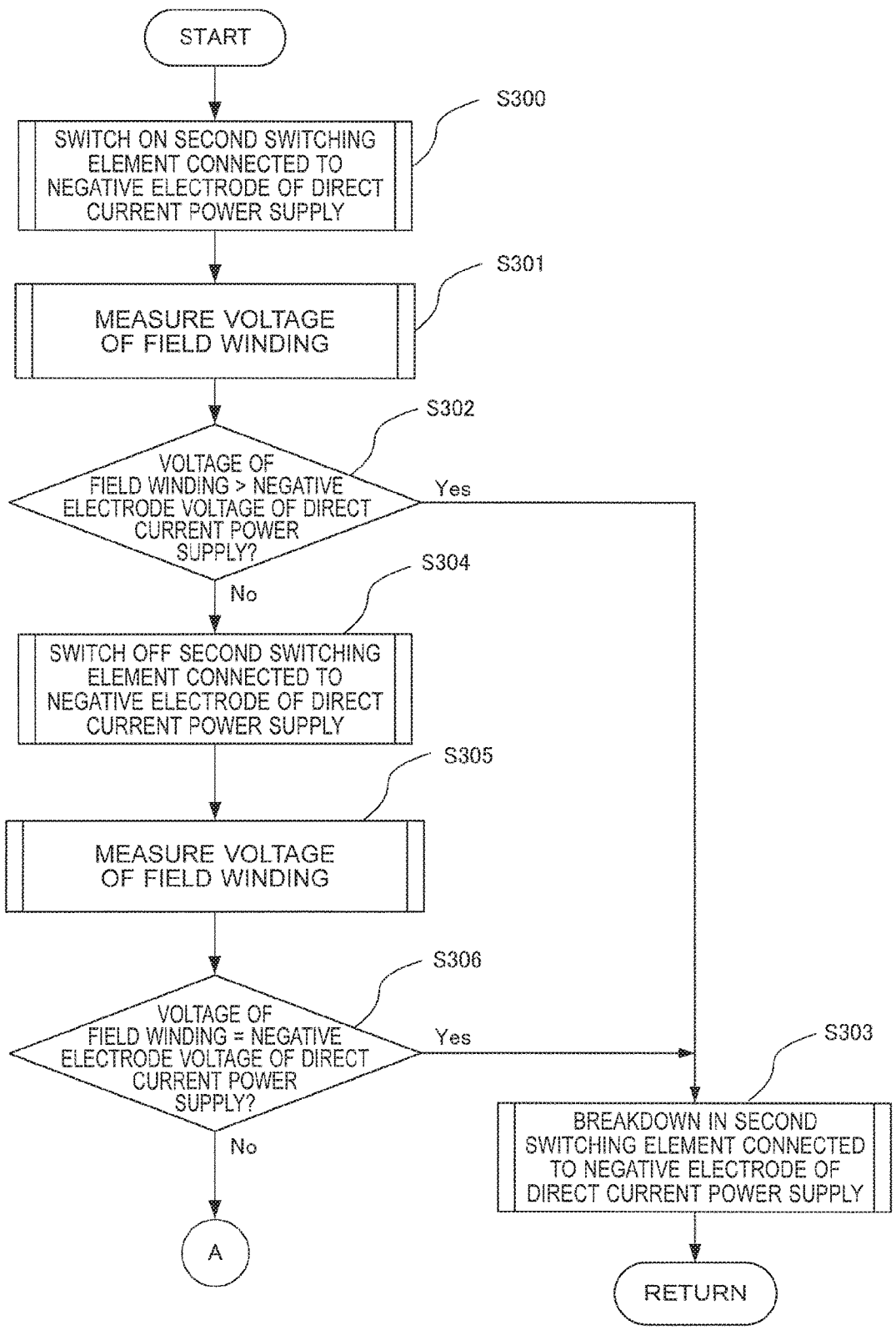
FIG. 8A is a first flowchart showing a diagnosis method for a field winding type rotating electric machine according to a fifth embodiment of the present invention.
Figure 8B:
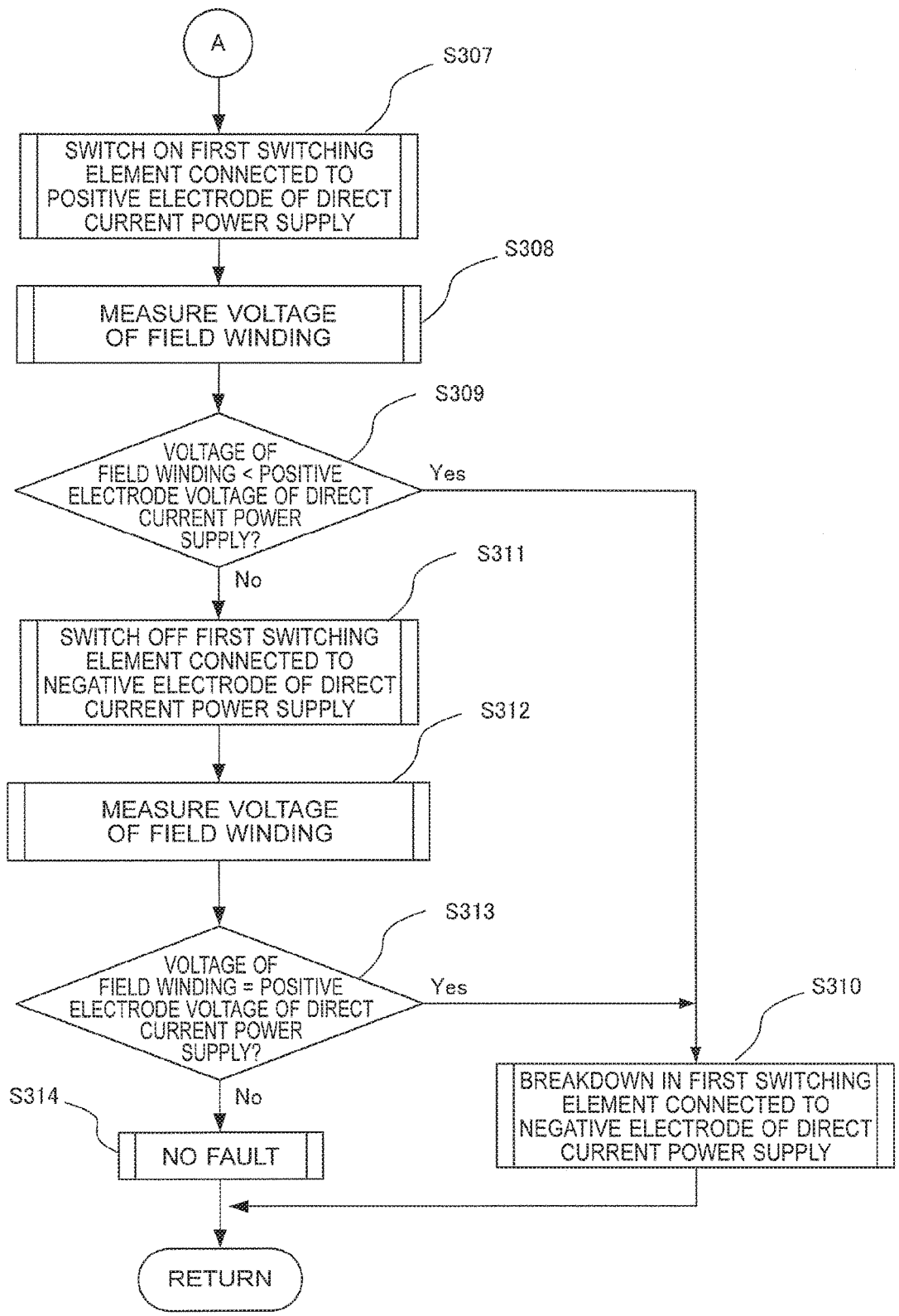
FIG. 8B is a second flowchart showing the diagnosis method for a field winding type rotating electric machine according to the fifth embodiment of the present invention.

FIG. 8A is a first flowchart showing a diagnosis method for a field winding type rotating electric machine according to the fifth embodiment of the present invention, and FIG. 8B is a second flowchart showing the diagnosis method for a field winding type rotating electric machine according to the fifth embodiment of the present invention.

A breakdown in the PWM switching element 62, the diagnosis switching element 13, or the recirculating element 61 includes a fault due to which the power semiconductor switching element cannot be switched ON and a fault due to which the power semiconductor switching element cannot be switched OFF.

According to the fifth embodiment, a breakdown in the PWM switching element 62, the diagnosis switching element 13, or the recirculating element 61 is diagnosed after confirming, in accordance with the flowchart shown in FIG. 2, that a fault has not occurred in the field circuit including the field winding 4 and the field driving circuit 6. An operation of the fault determination unit 15 will be described below using FIGS. 8A and 8B.

First, in step S300 of FIG. 8A, the fault determination unit 15 switches a second switching element of the power semiconductor switching element, such as a MOSFET, used as the PWM switching element 62, the diagnosis switching element 13, or the recirculating element 61, the second switching element being connected to the negative electrode of the direct current power supply 2, ON via the field driving circuit 6, a charge pump circuit, or a push-pull type predriver (not shown) that uses a drive power source generated by a bootstrap capacitor circuit, or the like, for example. The fault determination unit 15 then waits for a time (referred to hereafter as a time Tm) required for the voltage of the wire connection end portion of the field winding 4 to stabilize. A method of setting the time Tm will be described in detail below.

Next, in step S301, the fault determination unit 15 obtains the measured voltage of the circuit including the field winding 4, measured by the voltage measurement unit 14.

Next, in step S302, the fault determination unit 15 checks whether or not the measured voltage of the circuit including the field winding 4, measured by the voltage measurement unit 14, is substantially higher than the negative electrode voltage of the direct current power supply 2. When the measured voltage is higher, the routine advances to step S303, where an ON breakdown is determined to have occurred in the second switching element. The fault diagnosis is then terminated. When the measured voltage is not higher, on the other hand, the routine advances to step S304.

Next, in step S304, the fault determination unit 15 switches the second switching element OFF via the field driving circuit 6, the pre-driver, or the like. The fault determination unit 15 then waits for the time Tm required for the voltage of the wire connection end portion of the field winding 4 to stabilize, whereupon the routine advances to step S305.

Next, in step S305, the fault determination unit 15 obtains the measured voltage of the circuit including the field winding 4, measured by the voltage measurement unit 14.

Next, in step S306, the fault determination unit 15 checks whether or not the measured voltage of the circuit including the field winding 4, measured by the voltage measurement unit 14, is substantially equal to the negative electrode voltage of the direct current power supply 2. When the measured voltage is equal, the routine advances to step S303, where an OFF breakdown is determined to have occurred in the second switching element. The fault diagnosis is then terminated. When the measured voltage is not equal, on the other hand, the routine advances to step S307 in FIG. 8B.

Note that when the recirculating element 61 is a power semiconductor switching element that is connected to the negative electrode voltage of the direct current power supply 2 together with the diagnosis switching element 13, as shown in FIG. 1, this means that a plurality of second switching elements exist. In this case, diagnoses are performed individually on the diagnosis switching element 13 and the recirculating element 61, and therefore the respective steps shown in FIG. 8A are executed individually on the respective switching elements.

Next, in step S307 of FIG. 8B, the fault determination unit 15 switches a first switching element of the power semiconductor switching element, such as a MOSFET, used as the PWM switching element 62, the diagnosis switching element 13, or the recirculating element 61, the first switching element being connected to the positive electrode of the direct current power supply 2, ON via the field driving circuit 6, the pre-driver, or the like. Then, similarly to step S300, the fault determination unit 15 waits for the time Tm required for the voltage of the wire connection end portion of the field winding 4 to stabilize.

Next, in step S308, the fault determination unit 15 obtains the measured voltage of the circuit including the field winding 4, measured by the voltage measurement unit 14.

Next, in step S309, the fault determination unit 15 checks whether or not the measured voltage of the circuit including the field winding 4, measured by the voltage measurement unit 14, is substantially lower than the positive electrode voltage of the direct current power supply 2. When the measured voltage is lower, the routine advances to step S310, where an ON breakdown is determined to have occurred in the first switching element. The fault diagnosis is then terminated. When the measured voltage is not lower, on the other hand, the routine advances to step S311.

Next, in step S311, the fault determination unit 15 switches the first switching element OFF via the field driving circuit 6, the pre-driver, or the like. The fault determination unit 15 then waits for the time Tm required for the voltage of the wire connection end portion of the field winding 4 to stabilize, whereupon the routine advances to step S312.

Next, in step S312, the fault determination unit 15 obtains the measured voltage of the circuit including the field winding 4, measured by the voltage measurement unit 14.

Next, in step S313, the fault determination unit 15 checks whether or not the measured voltage of the circuit including the field winding 4, measured by the voltage measurement unit 14, is substantially equal to the positive electrode voltage of the direct current power supply 2. When the measured voltage is equal, the routine advances to step S310, where an OFF breakdown is determined to have occurred in the first switching element. The fault diagnosis is then terminated. When the measured voltage is not equal, on the other hand, the routine advances to step S314.

Next, in step S314, the fault determination unit 15 determines that a breakdown has not occurred in any of the power semiconductor switching elements such as the PWM switching element 62, the diagnosis switching element 13, and the recirculating element 61. The fault diagnosis is then terminated.

Note that the time Tm required for the voltage of the wire connection end portion of the field winding 4 to stabilize in steps S300 and S304 of FIG. 8A and steps S307 and S311 of FIG. 8B is defined by Equation (17), shown below, in a case where the power semiconductor switching element that constitutes the PWM switching element 62, the diagnosis switching element 13, or the like and is connected to the negative electrode voltage of the direct current power supply 2 in the configuration shown in FIG. 6, for example, is switched ON.

$$Tm \geq -\tau \times \ln(\beta) \tag{17}$$

Here, Lcf denotes an inductance of the field winding 4, Rpu denotes the resistance value of the pull-up resistor 110, τ denotes a time constant of an LR circuit, which is determined by the inductance Lcf of the field winding 4 and the resistance value Rpu, and β denotes a ratio of the voltage of the wire connection end portion of the field winding 4 relative to the negative electrode voltage of the direct current power supply 2, which is used as a coefficient for determining that the voltage of the wire connection end portion of the field winding 4 has stabilized.

When β is set at 0.05, for example, the time Tm must be set at approximately three times the time constant τ. Note that when the power semiconductor switching element that constitutes the PWM switching element 62, the diagnosis switching element 13 or the like and is connected to the negative electrode voltage of the direct current power supply 2 in the configuration shown in FIG. 6 is switched ON, a short-circuit can be confirmed in the field winding 4 by measuring a time required for the voltage of the wire connection end portion of the field winding 4 to reach 63.2% of the positive electrode voltage of the direct current power supply 2 and comparing the measured time with the time constant τ in steps S300 and S301 of FIG. 8A.

In other words, when the time required for the voltage of the wire connection end portion of the field winding 4 to reach 63.2% of the positive electrode voltage of the direct current power supply 2 is sufficiently shorter than the time constant τ, a short-circuit is determined to have occurred in the field winding 4.

Note that in FIGS. 8A and 8B, the breakdown diagnosis is implemented first on the second switching element, among the first switching element connected to the positive electrode of the direct current power supply 2 and the second switching element connected to the negative electrode of the direct current power supply 2.

In particular, when a push-pull type pre-driver (not shown) that uses a drive power source generated by a bootstrap capacitor circuit is used in the field driving circuit 6 or the like, the fault detection processing must be implemented first on the power semiconductor switching element connected to the negative electrode voltage of the direct current power supply 2 in order to charge the bootstrap capacitor.

According to the fifth embodiment, as described above, after confirming that none of the power fault, the earth fault, and the open fault have occurred in the field circuit including the field winding and the field driving circuit, the measured voltage of the wire connection end portion of the field winding is checked by switching the power semiconductor switching element, such as a MOSFET, used as the PWM switching element, the diagnosis switching element, or the recirculating element ON and OFF individually.

In so doing, a breakdown in the power semiconductor switching element, such as a MOSFET, used as the PWM switching element, the diagnosis switching element, or the recirculating element can be diagnosed.

Further, after switching the power semiconductor switching element, such as a MOSFET, used as the PWM switching element, the diagnosis switching element, or the recirculating element ON and OFF individually, the processing is paused for the time Tm required for the voltage of the wire connection end portion of the field winding to stabilize, and therefore erroneous detection of a breakdown during a voltage transition period of the voltage of the wire connection end portion of the field winding can be prevented.

Moreover, of the first switching element connected to the positive electrode of the direct current power supply and the second switching element connected to the negative electrode of the direct current power supply, the breakdown diagnosis is implemented first on the second switching element. Therefore, when a push-pull type pre-driver that uses a drive power source generated by a bootstrap capacitor circuit is used in the field driving circuit or the like, the bootstrap capacitor can be charged, and as a result, a situation in which the power semiconductor switching element cannot be switched ON due to a charge deficiency in the bootstrap capacitor can be avoided.

Note that the method of diagnosing a breakdown in the PWM switching element 62, the diagnosis switching element 13, or the recirculating element 61 according to the fifth embodiment may be applied to the diagnosis apparatus 1 for a field winding type rotating electric machine according to any of the first to fourth embodiments.

Sixth Embodiment

In a sixth embodiment, a method of suppressing the power consumption of the diagnosis apparatus 1 for a field winding type rotating electric machine during a normal operation in which the fault diagnosis is not performed by providing switches for switching respective power supplies supplied to the first diagnosis circuit 11 and the second diagnosis circuit 12 ON or OFF will be described.

Figure 9:
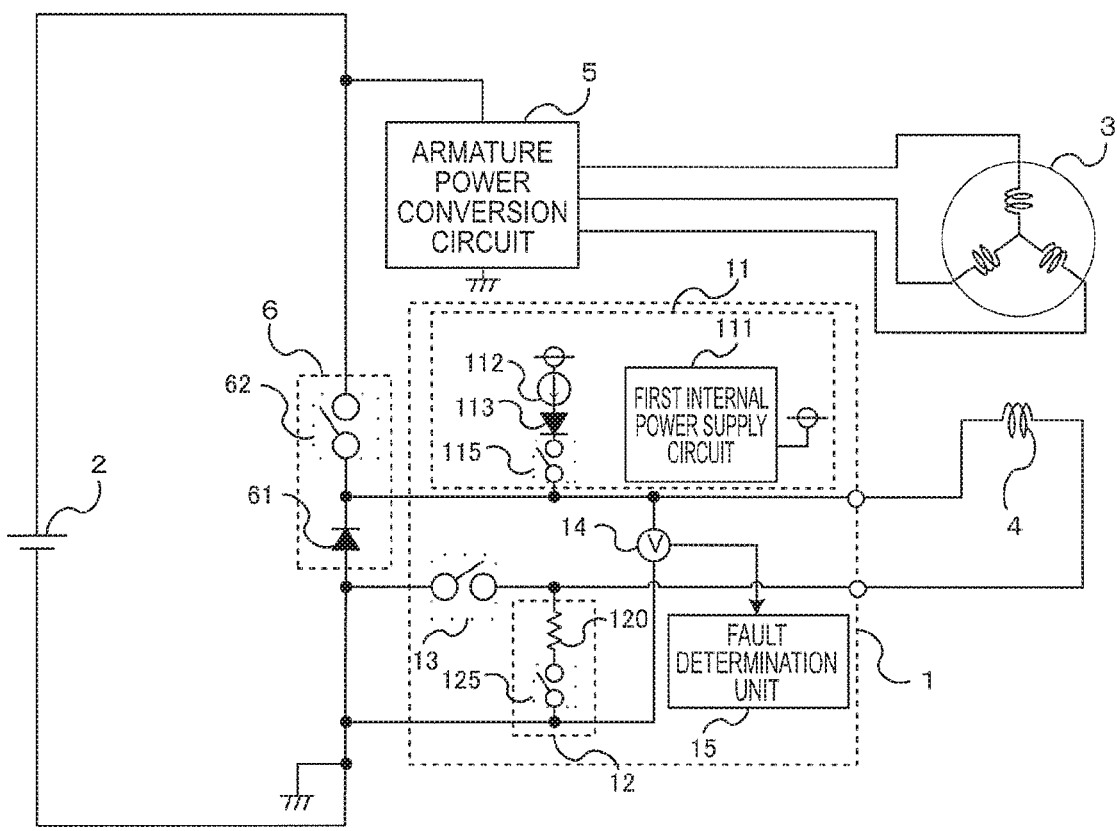
FIG. 9 is a view showing an example of a configuration of a diagnosis apparatus for a field winding type rotating electric machine according to a sixth embodiment of the present invention.

FIG. 9 is a view showing an example of a configuration of the diagnosis apparatus 1 for a field winding type rotating electric machine according to the sixth embodiment of the present invention. The diagnosis apparatus 1 shown in FIG. 9 differs from that of FIG. 1 in further including a first switch 115 that switches the power supply supplied to the first diagnosis circuit 11 ON or OFF. The diagnosis apparatus 1 also includes a second switch 125 that switches the power supply supplied to the second diagnosis circuit 12 ON or OFF.

All other configurations are identical to FIG. 1, and likewise with the diagnosis apparatus 1 configured as shown in FIG. 9, a fault can be diagnosed in the field circuit including the field winding 4 and the field driving circuit 6 by following the flowchart shown in FIG. 2.

Note that FIG. 9 shows an example in which the first switch 115 is provided between the first diode 113 and the positive electrode side end portion of the field winding 4, but the first switch 115 may be provided in any position in the first diagnosis circuit 11 as long as it is capable of switching the connection between the positive electrode voltage of the first internal power supply circuit 111 and the positive electrode side end portion of the field winding 4 ON or OFF.

Further, FIG. 9 shows an example in which the second switch 125 is provided between the pull-down resistor 120 and the negative electrode of the direct current power supply 2, but the second switch 125 may be provided in any position in the second diagnosis circuit 12 as long as it is capable of switching the connection between the negative electrode side end portion of the field winding 4 and the negative electrode of the direct current power supply 2 ON or OFF.

Furthermore, FIG. 9 shows an example in which the first switch 115 and the second switch 125 are provided in the configuration of FIG. 1, but the first switch 115 and the second switch 125 may also be applied to the configurations shown in FIGS. 3 to 7, and in these cases similar effects are obtained.

During a normal operation of the field winding type rotating electric machine, in which the fault diagnosis is not performed, in a case where the first switch 115 and the second switch 125 are provided, the power consumption of the first diagnosis circuit 11 and the second diagnosis circuit 12 can be suppressed by switching the first switch 115 and the second switch 125 OFF. Note that the first switch 115 and the second switch 125 are configured using semiconductor switches such as transistors or MOSFETs, for example.

More specifically, the first switch 115 and the second switch 125 may be switched ON in accordance with an OFF timing of the diagnosis switching element 13 when the fault diagnosis is started, and may be switched OFF in accordance with an ON timing of the diagnosis switching element 13 when the fault diagnosis is terminated.

According to the sixth embodiment, as described above, the first switch is provided in the first diagnosis circuit to switch the connection between the positive electrode voltage of the first internal power supply circuit and the positive electrode side end portion of the field winding ON or OFF, and the second switch is provided in the second diagnosis circuit to switch the connection between the negative electrode side end portion of the field winding and the negative electrode of the direct current power supply ON or OFF, and the first and second switches are switched OFF during a normal operation in which the fault diagnosis is not performed. As a result, the power consumption of the diagnosis apparatus for a field winding type rotating electric machine can be suppressed during a normal operation in which the fault diagnosis is not performed.

Note that in the first to sixth embodiments, the positive electrode voltage of the direct current power supply 2 varies in accordance with the charging/discharging condition of the direct current power supply 2, and therefore, when the positive electrode voltage of the direct current power supply 2 is equal to or lower than the voltage of the wire connection end portion of the field winding 4 in a case where no fault has occurred, the power fault determination processing is not performed in order to avoid erroneous detection of the power fault.

At this time, the positive electrode voltage of the direct current power supply 2 may be obtained using a method of adding a similar circuit to the voltage measurement unit 14 to the positive electrode of the direct current power supply 2, or a method of obtaining the positive electrode voltage through communication with the control unit (not shown) of the diagnosis apparatus 1 for a field winding type rotating electric machine or the upper order controller (not shown) of the diagnosis apparatus 1 for a field winding type rotating electric machine, for example.

The invention claimed is:

1. A diagnosis apparatus for a field winding type rotating electric machine having a field winding, an armature winding, and a direct current power supply that serves as a power supply source for the field winding and the armature winding, the diagnosis apparatus being applied to a rotating electric machine that operates as a motor or a power generator, and comprising:
a diagnosis circuit that includes an internal power supply circuit having an open fault determination potential set at a different value to a positive electrode potential and a negative electrode potential of the direct current power supply so that in a fault diagnosis condition in which an induced current generated by a relative rotary motion of the armature winding does not flow through the field winding, the diagnosis circuit performs a fault diagnosis on a circuit including the field winding by measuring a voltage value of the circuit including the field winding that is generated when a current is passed through the field winding using the internal power supply circuit,
wherein, on the basis of a measurement result of the voltage value of the circuit including the field winding in the fault diagnosis condition, the diagnosis circuit:
determines that a disconnection has occurred in the circuit when the measurement result is within an open fault determination voltage range including the open fault determination potential;
determines that a power fault has occurred in the circuit when the measurement result is within a power fault determination voltage range including the positive electrode potential; and
determines that an earth fault has occurred in the circuit when the measurement result is within an earth fault determination voltage range including the negative electrode potential.

2. The diagnosis apparatus for a field winding type rotating electric machine according to claim 1, wherein the field winding is drive-controlled while connected in parallel to a recirculating element by performing PWM driving on a field driving circuit that is configured by connecting a PWM switching element and the recirculating element in series to the direct current power supply,
the diagnosis circuit includes:
a first diagnosis circuit connected to a positive electrode side end portion of the field winding;
a second diagnosis circuit connected to a negative electrode side end portion of the field winding;
a diagnosis switching element that switches ON or OFF a connection between respective electrode side end portions of the recirculating element and the field winding that are not connected to the PWM switching element, among positive electrode side end portions and negative electrode side end portions of the recirculating element and the field winding;
a voltage measurement unit that measures a voltage of the positive electrode side end portion or the negative electrode side end portion of the field winding using a negative electrode voltage of the direct current power supply as a reference; and
a fault determination unit that determines the presence of the power fault, the earth fault, and the open fault in a field circuit including the field driving circuit and the field winding on the basis of the measured voltage of the field winding, measured by the voltage measurement unit,
the first diagnosis circuit is configured to include:
a first internal power supply circuit;
a first diode that prevents a current from flowing in a direction of the first internal power supply circuit from the field winding; and
either an ejection type constant current circuit that passes a constant current from the first internal power supply circuit to the field winding or a pull-up resistor, the ejection type constant current circuit and the pull-up resistor being inserted in series between the first internal power supply circuit and the first diode,
the second diagnosis circuit is configured to include at least one of a sink type constant current circuit that passes a constant current from the field winding to a negative electrode of the direct current power supply, and a pull-down resistor,
in the fault diagnosis condition, which is a condition in which the PWM switching element and the diagnosis switching element are OFF and the induced current generated by the relative rotary motion of the armature winding does not flow through the field winding, the fault determination unit:
determines that the power fault has occurred when the measured voltage of the field winding, measured by the voltage measurement unit, is substantially equal to a positive electrode voltage of the direct current power supply;
determines that the earth fault has occurred when the measured voltage of the field winding, measured by the voltage measurement unit, is substantially equal to the negative electrode voltage of the direct current power supply; and
determines that the open fault has occurred when the measured voltage of the field winding, measured by the voltage measurement unit, is substantially equal to the open fault determination potential, which is determined in advance in order to determine the presence of the open fault.

3. The diagnosis apparatus for a field winding type rotating electric machine according to claim 2, wherein the PWM switching element is connected to a positive electrode side end portion of the recirculating element,
in the fault diagnosis condition, a resistance value of the pull-down resistor is set on the basis of:
a positive electrode voltage of the first internal power supply circuit; and
a first leak current I1 that flows from a positive electrode of the direct current power supply to the field winding via the field driving circuit, and
in the fault diagnosis condition, a resistance value of the pull-up resistor is set on the basis of:
the positive electrode voltage of the first internal power supply circuit;
a voltage of the field winding in a condition where no fault has occurred;
a constant current value of the sink type constant current circuit; and the first leak current I1 that flows from the positive electrode of the direct current power supply to the field winding via the field driving circuit.

4. The diagnosis apparatus for a field winding type rotating electric machine according to claim 2, wherein the PWM switching element is connected to the positive electrode side end portion of the recirculating element, in the fault diagnosis condition, a constant current value of the ejection type constant current circuit is set to be larger than a value obtained by subtracting a first leak current I1 that flows from a positive electrode of the direct current power supply to the field winding via the field driving circuit from a sum of a current flowing through the pull-down resistor and a second leak current I2 that flows from the field winding to a negative electrode of the direct current power supply, and in the fault diagnosis condition, a constant current value of the sink type constant current circuit is set to be larger than a value of the first leak current I1 that flows from the positive electrode of the direct current power supply to the field winding via the field driving circuit.

5. The diagnosis apparatus for a field winding type rotating electric machine according to claim 2, wherein the first diagnosis circuit includes the ejection type constant current circuit, the second diagnosis circuit includes the pull-down resistor, one end of the pull-down resistor being connected to the negative electrode side end portion of the field winding and another end being connected to a negative electrode of the direct current power supply, the voltage measurement unit measures the voltage of the positive electrode side end portion of the field winding, and the open fault determination potential is a positive electrode voltage of the first internal power supply circuit.

6. The diagnosis apparatus for a field winding type rotating electric machine according to claim 5, wherein the second diagnosis circuit further includes the sink type constant current circuit, the sink type constant current circuit being inserted in series between the pull-down resistor and the negative electrode of the direct current power supply.

7. The diagnosis apparatus for a field winding type rotating electric machine according to claim 2, wherein the first diagnosis circuit includes the ejection type constant current circuit, the second diagnosis circuit includes the pull-down resistor and further includes a second internal power supply circuit, the pull-down resistor pulling down the voltage of the negative electrode side end portion of the field winding to a positive electrode voltage of the second internal power supply circuit, the voltage measurement unit measures the voltage of the negative electrode side end portion of the field winding, and the open fault determination potential is the positive electrode voltage of the second internal power supply circuit.

8. The diagnosis apparatus for a field winding type rotating electric machine according to claim 2, wherein the first diagnosis circuit includes the pull-up resistor, the pull-up resistor being inserted in series between the first internal power supply circuit and the first diode, the second diagnosis circuit includes the sink type constant current circuit, the voltage measurement unit measures the voltage of the positive electrode side end portion of the field winding, and the open fault determination potential is a positive electrode voltage of the first internal power supply circuit.

9. The diagnosis apparatus for a field winding type rotating electric machine according to claim 2, wherein a positive electrode voltage of the first internal power supply circuit is set to be lower than a minimum value of a voltage variation range of the positive electrode voltage of the direct current power supply at which the field winding type rotating electric machine operates normally.

10. The diagnosis apparatus for a field winding type rotating electric machine according to claim 2, wherein the first diagnosis circuit includes the ejection type constant current circuit and further includes a voltage regulation unit inserted in series between the ejection type constant current circuit and the first diode, and in the fault diagnosis condition, the voltage regulation unit realizes an equivalent effect to that of a circuit on which a positive electrode voltage of the first internal power supply circuit is set to be lower than a minimum value of a voltage variation range of the positive electrode voltage of the direct current power supply at which the field winding type rotating electric machine operates normally, by enlarging a potential difference between the positive electrode voltage of the first internal power supply circuit and a voltage of a wire connection end portion of the field winding.

11. The diagnosis apparatus for a field winding type rotating electric machine according to claim 10, wherein the voltage regulation unit is configured using a voltage regulator diode, a cathode side of which is connected to a positive electrode side of the first internal power supply circuit.

12. The diagnosis apparatus for a field winding type rotating electric machine according to claim 10, wherein the voltage regulation unit is configured using a diode, an anode side of which is connected to a positive electrode side of the first internal power supply circuit.

13. The diagnosis apparatus for a field winding type rotating electric machine according to claim 2, wherein the first diagnosis circuit further includes a first switch that switches a connection in the first diagnosis circuit between a positive electrode of the first internal power supply circuit and the positive electrode side end portion of the field winding ON or OFF, the second diagnosis circuit further includes a second switch that switches a connection in the second diagnosis circuit between the negative electrode of the direct current power supply and the negative electrode side end portion of the field winding ON or OFF, and the first switch and the second switch are switched OFF when the diagnosis switching element is ON, and switched ON when the diagnosis switching element is OFF.

14. The diagnosis apparatus for a field winding type rotating electric machine according to claim 2, wherein when the positive electrode voltage of the direct current power supply is equal to or lower than a voltage of a wire connection end portion of the field winding in the fault diagnosis condition, the fault determination unit does not determine the presence of the power fault.

15. The diagnosis apparatus for a field winding type rotating electric machine according to claim 2, wherein in the fault diagnosis condition, the fault determination unit determines that a breakdown has occurred in a second switching element, which is a switching element among the PWM switching element and the diagnosis switching element that is connected to a negative electrode of the direct current power supply, when the measured voltage of the field winding is higher than the negative electrode voltage of the direct current power supply in a case where the second switching element is ON, or when the measured voltage of the field winding is substantially equal to the negative electrode voltage of the direct current power supply in a case where the second switching element is OFF, and determines that a breakdown has occurred in a first switching element, which is a switching element among the PWM switching element and the diagnosis switching element that is connected to a positive electrode of the direct current power supply, when the measured voltage of the field winding is lower than the positive electrode voltage of the direct current power supply in a case where the first switching element is ON, or when the measured voltage of the field winding is substantially equal to the positive electrode voltage of the direct current power supply in a case where the first switching element is OFF.

16. The diagnosis apparatus for a field winding type rotating electric machine according to claim 15, wherein the fault determination unit implements a breakdown diagnosis on the second switching element first, among the first switching element and the second switching element.

17. A diagnosis method for a field winding type rotating electric machine, having a field winding, an armature winding, and a direct current power supply that serves as a power supply source for the field winding and the armature winding, the diagnosis method being applied to a rotating electric machine that operates as a motor or a power generator, and including a diagnosis circuit that includes an internal power supply circuit having an open fault determination potential set at a different value to a positive electrode potential and a negative electrode potential of the direct current power supply so that in a fault diagnosis condition in which an induced current generated by a relative rotary motion of the armature winding does not flow through the field winding, the diagnosis circuit performs a fault diagnosis on a circuit including the field winding by measuring a voltage value of the circuit including the field winding that is generated when a current is passed through the field winding using the internal power supply circuit, wherein, on the basis of a measurement result of the voltage value of the circuit including the field winding in the fault diagnosis condition, the diagnosis circuit;

determining that a disconnection has occurred in the circuit when the measurement result is within an open fault determination voltage range including the open fault determination potential;

determining that a power fault has occurred in the circuit when the measurement result is within a power fault determination voltage range including the positive electrode potential; and determining that an earth fault has occurred in the circuit when the measurement result is within an earth fault determination voltage range including the negative electrode potential.

\* \* \* \* \*